(12) United States Patent
Kim et al.

(10) Patent No.: US 8,293,569 B2
(45) Date of Patent: Oct. 23, 2012

(54) ORGANIC THIN FILM TRANSISTOR ARRAY PANEL AND METHOD OF MANUFACTURING THE SAME

(75) Inventors: Bo-Sung Kim, Seoul (KR); Mun-Pyo Hong, Seongnam-si (KR); Woo-Jae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 12/889,613

(22) Filed: Sep. 24, 2010

(65) Prior Publication Data

US 2011/0014736 A1 Jan. 20, 2011

Related U.S. Application Data

(62) Division of application No. 11/416,968, filed on May 3, 2006, now abandoned.

(30) Foreign Application Priority Data

May 3, 2005 (KR) .................. 10-2005-0037082

(51) Int. Cl.
*H01L 51/40* (2006.01)
(52) U.S. Cl. ............... 438/99; 257/40; 257/E51.001
(58) Field of Classification Search .............. 257/40, 257/E51.001; 438/99
See application file for complete search history.

(56) References Cited

U.S. PATENT DOCUMENTS

| | | | |
|---|---|---|---|
| 6,087,196 A | 7/2000 | Sturm et al. | |
| 6,413,790 B1 | 7/2002 | Duthaler et al. | |
| 7,612,838 B2 | 11/2009 | Lim et al. | |
| 2002/0155661 A1 | 10/2002 | Massingill et al. | |
| 2003/0068581 A1 | 4/2003 | Kawamura et al. | |
| 2004/0119073 A1 | 6/2004 | Ardakami et al. | |
| 2004/0238814 A1 | 12/2004 | Mizusaki et al. | |
| 2004/0253835 A1 | 12/2004 | Kawase | |
| 2005/0062407 A1 | 3/2005 | Suh et al. | |
| 2005/0211975 A1 | 9/2005 | Kawasaki et al. | |
| 2006/0051888 A1 | 3/2006 | Koo et al. | |
| 2006/0208266 A1 | 9/2006 | Yamamoto | |

FOREIGN PATENT DOCUMENTS

| | | |
|---|---|---|
| CN | 1561552 | 1/2005 |
| JP | 2001148483 | 5/2001 |
| JP | 2001244467 | 9/2001 |
| JP | 2003202587 | 7/2003 |
| JP | 2003229579 | 8/2003 |
| JP | 2003318190 | 11/2003 |
| JP | 200431933 | 1/2004 |
| JP | 2004141856 | 5/2004 |
| JP | 2004260057 | 9/2004 |
| JP | 2004273982 | 9/2004 |
| JP | 2004297011 | 10/2004 |
| JP | 2007527542 | 9/2007 |
| KR | 20030023624 | 3/2003 |
| KR | 20030056245 | 7/2003 |
| KR | 1020040000462 | 1/2004 |
| KR | 1020040015717 | 2/2004 |
| KR | 1020040015806 | 2/2004 |
| KR | 1020040030804 | 4/2004 |
| WO | 2004100282 | 11/2004 |

*Primary Examiner* — Anthony Ho
(74) *Attorney, Agent, or Firm* — Cantor Colburn LLP

(57) ABSTRACT

An organic thin film transistor ("TFT") array panel includes a substrate, a gate line extending in a first direction, a data line extending in a second direction, intersecting with and insulated from the gate line, a source electrode connected to the data line, a drain electrode facing the source electrode, a pixel electrode connected to the drain electrode, and an organic semiconductor connected to the source electrode and the drain electrode, the organic semiconductor made of an organic material with photosensitivity.

13 Claims, 24 Drawing Sheets

ORGANIC THIN FILM TRANSISTOR ARRAY PANEL AND METHOD OF MANUFACTURING THE SAME

This application is a divisional of U.S. application Ser. No. 11/416,968, filed on, May 3, 2006, which claims priority to Korean Patent Application No. 10-2005-0037082, filed on May 3, 2005 and all the benefits accruing therefrom under 35 U.S.C. §119, and the contents of which in its entirety are herein incorporated by reference.

BACKGROUND OF THE INVENTION (a) Field of the Invention

The present invention relates to an organic thin film transistor ("TFT") array panel and a method of manufacturing the same. More particularly, the present invention relates to an organic TFT array panel with high resolution organic TFTs and a method of manufacturing the same.

(b) Description of the Related Art

Organic TFTs have been studied as driving elements for next-generation display devices.

An organic TFT is obtained by replacing an inorganic material such as silicon (Si) with an organic material in a conventional TFT based on the inorganic material. The organic TFT can be inexpensively produced because it can be manufactured at a low temperature through a single process. In addition, the organic TFT is applicable to a flexible display device because it can be fabricated in the form of fiber or a film.

Generally, an organic semiconductor of the organic TFT is formed by deposition, spin coating, slit coating, or printing. However, in all cases, a photo etching process using a photoresist film or a barrier forming process is additionally required to form a semiconductor pattern.

BRIEF SUMMARY OF THE INVENTION

Exemplary embodiments of the present invention provides an organic TFT array panel with high resolution organic TFTs.

The present invention also provides exemplary manufacturing methods for the organic TFT array panel.

According to exemplary embodiments of the present invention, an organic TFT array panel includes a substrate, a gate line extending in a first direction, a data line extending in a second direction, intersecting with and insulated from the gate line, a source electrode connected to the data line, a drain electrode facing the source electrode, a pixel electrode connected to the drain electrode, and an organic semiconductor connected to the source electrode and the drain electrode, is the organic semiconductor made of an organic material with photosensitivity.

According to other exemplary embodiments of the present invention, a method of manufacturing an organic TFT array panel includes forming a gate line on a substrate, forming a gate insulating layer on the gate line, forming a drain electrode and a data line with a source electrode on the gate insulating layer, forming a layer of a photosensitive organic material on the data line and the drain electrode, forming an organic semiconductor by selectively exposing the layer of photosensitive organic material to light, forming an insulation pattern covering the organic semiconductor, and forming a pixel electrode connected to the drain electrode.

According to still other exemplary embodiments of the present invention, a method of manufacturing an organic TFT array panel includes forming a data line on a substrate, forming an insulating layer on the data line, forming a gate line on the insulating layer, forming a gate insulating layer with a contact hole, partially exposing the data line, on the gate line and the insulating layer, forming a source electrode connected to the data line through the contact hole and a pixel electrode with a drain electrode facing the source electrode on the gate insulating layer, forming a layer of a photosensitive organic material on the source electrode and the pixel electrode, forming an organic semiconductor by selectively exposing the photosensitive organic material layer to light, and forming an insulation pattern covering the organic semiconductor.

According to still other exemplary embodiments of the present invention, a method of manufacturing an organic TFT includes forming a layer of photosensitive organic material, having a first resolution, on a source electrode and a drain electrode, and forming an organic semiconductor having a second resolution, higher than the first resolution, after patterning the layer of organic material by photolithography.

BRIEF DESCRIPTION OF THE DRAWINGS

The above features and other advantages of the present invention will become more apparent by describing the preferred embodiments thereof in more detail with reference to the accompanying drawings in which.

DETAILED DESCRIPTION OF THE INVENTION

Figure 1:
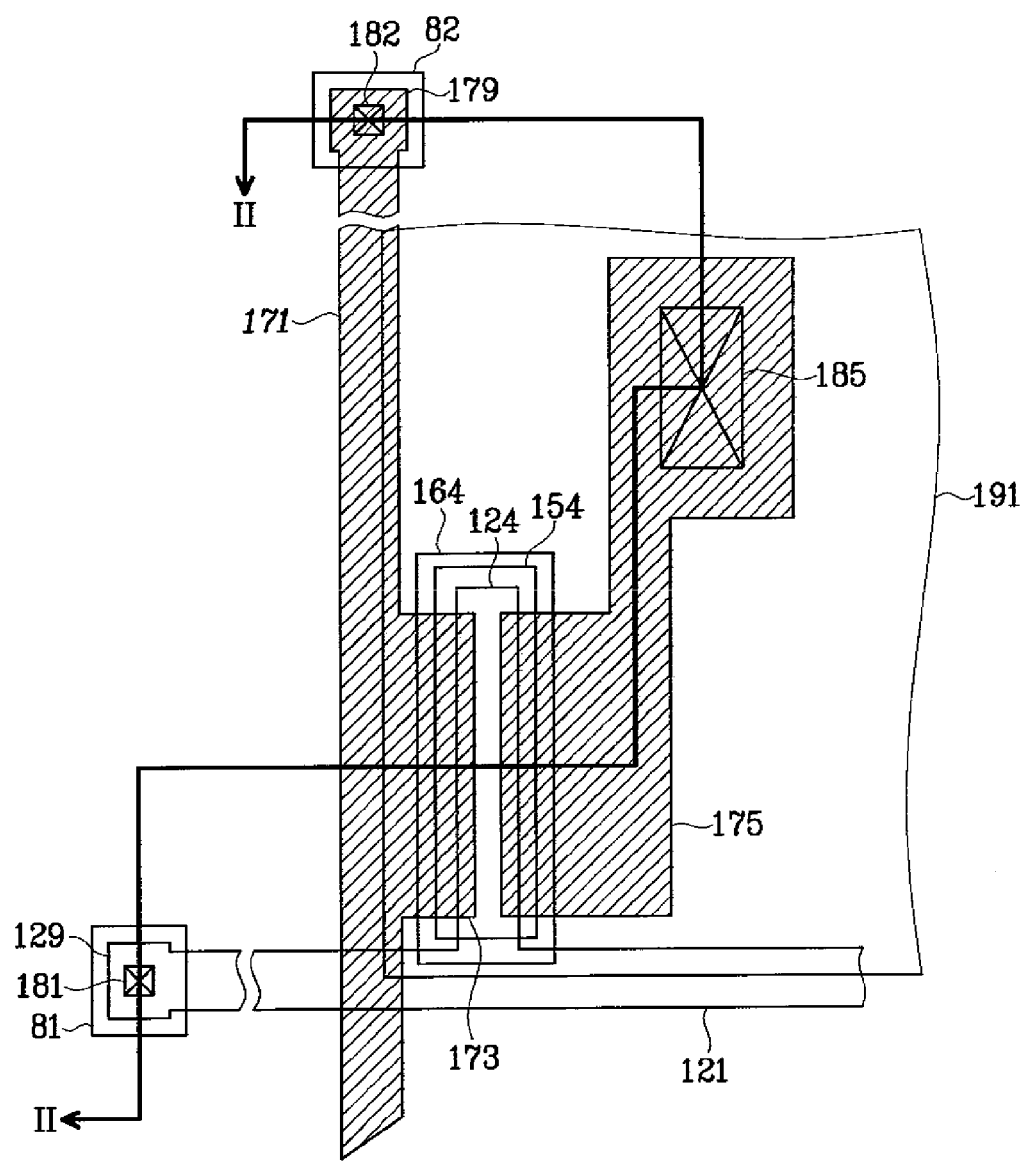
FIG. 1 is a layout view of an exemplary organic TFT array panel according to an exemplary embodiment of the present invention.

Preferred embodiments of the present invention are now described more fully hereinafter with reference to the accompanying drawings, in which preferred embodiments of the invention are shown. The present invention may, however, be embodied in different forms and thus the present invention should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. When an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, an exemplary organic TFT array panel according to an exemplary embodiment of the present invention will be described with reference to FIG. 1 and FIG. 2.

Figure 2:
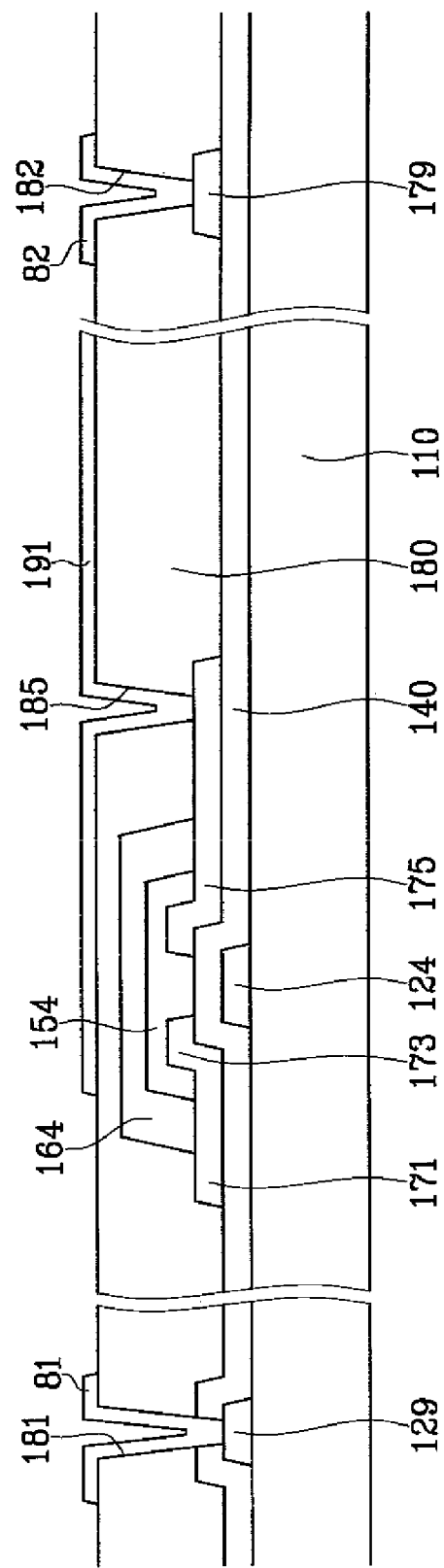
FIG. 2 is a schematic cross-sectional view cut along line II-II of FIG. 1.

FIG. 1 is a layout view of an exemplary organic TFT array panel according to an exemplary embodiment of the present invention, and FIG. 2 is a schematic cross-sectional view cut along line II-Ii of FIG. 1.

Referring to FIG. 1 and FIG. 2, a plurality of gate lines 121 are formed on an insulating substrate 110 made of transparent glass or plastic.

The gate lines 121 for transmitting gate signals extend substantially in a first direction, such as a horizontal direction. The gate lines 121 may extend substantially parallel to each other. Each gate line 121 includes a plurality of gate electrodes 124 protruding in a direction at an angle to the first direction, such as substantially perpendicularly. The gate electrodes 124 protrude towards an interior of each pixel region partly defined by each gate line 121. Each gate line 121 may further include an end portion 129 having a relatively large dimension to connect to a different layer or an external device. Gate drivers (not shown) for generating the gate signals may be mounted on a flexible printed circuit (not shown) attached to the substrate 110, or directly on the substrate 110. Otherwise, the gate drivers may be integrated into the substrate 110 in which case, the gate lines 121 are directly connected to the gate drivers.

The gate lines 121 are preferably made of an aluminum (Al)-containing metal such as Al or an Al alloy, a silver (Ag)-containing metal such as Ag or a Ag alloy, a gold (Au)-containing metal such as Au or a Au alloy, a copper (Cu)-containing metal such as Cu or a Cu alloy, a molybdenum (Mo)-containing metal such as Mo and a Mo alloy, chrome (Cr), titanium (Ti), or tantalum (Ta). The gate lines 121 may be configured as a multi-layered structure, in which at least two conductive layers (not shown) having different physical properties are included. In such a structure, one of the two conductive layers is made of a low-resistivity metal in order to reduce delay of the signals or voltage drop in the gate lines 121. Another conductive layer in a multi-layered structure is made of a material having prominent physical, chemical, and electrical contact properties with other materials such as indium tin oxide ("ITO") and indium zinc oxide ("IZO"). Besides the materials described above, various other metals and conductors and combinations thereof can be used to form the gate lines 121.

All lateral sides of the gate lines 121 preferably slope between about 30° and about 80° relative to the surface of the substrate 110.

A gate insulating layer 140 is formed on the gate lines 121, and may be further formed on exposed surfaces of the substrate 110 not covered by the gate lines 121. The gate insulating layer 140 may be made of an inorganic insulator, such as silicon nitride ($SiN_x$) or silicon oxide ($SiO_2$), or an organic insulator, such as maleimide-styrene, polyvinylalcohol (PVA), or modified cyanoethypullulan (m-CEP). The gate insulating layer 140 made of $SiN_x$ may be surface-treated with octadecyltrichlorosilane (OTS).

A plurality of data lines 171 and a plurality of drain electrodes 175 are formed on the gate insulating layer 140.

The data lines 171 for transmitting data signals extend substantially in a second direction, such as a vertical direction, to cross the gate lines 121. The second direction may be substantially perpendicular to the first direction. The plurality of data lines 171 cross the plurality of gate lines 121 to define a matrix of pixel regions there between. Each data line 171 includes a plurality of source electrodes 173 extending toward the respective gate electrodes 124, such as by protruding from the data line 171 in the first direction, and an end portion 179 having a relatively large dimension to connect to a different layer or an external device. Data drivers (not shown) for generating the data signals may be mounted on a flexible printed circuit (not shown) attached to the substrate 110, or directly on the substrate 110. Otherwise, the data drivers may be integrated into the substrate 110, in which case, the data lines 171 are directly connected to the date drivers.

The drain electrodes 175 that are separated from the data lines 171 are disposed opposite to the source electrodes 173, centering on the gate electrodes 124. That is, a portion of each drain electrode 175 overlaps each respective gate electrode 124, and is spaced from each source electrode 173, where the space between the source electrode 173 and the drain electrode 175 is centered over each gate electrode 124 to form a channel thereon. The drain electrode 175 may further include an extension portion, extending away from the gate electrode 124, for connection with a pixel electrode 191, as will be further described below.

The data lines 171 and the drain electrodes 175 are preferably made of an Al-containing metal such as Al or an Al alloy, a Ag-containing metal such as Ag or a Ag alloy, a Au-containing metal such as Au or a Au alloy, a Cu-containing metal such as Cu or a Cu alloy, a Mo-containing metal such as Mo and a Mo alloy, nickel (Ni), Cr, Ti, Ta, or ITO. The data lines 171 and the drain electrodes 175 may be configured as a multi-layered structure, in which at least two conductive layers (not shown) having different physical properties are included. In such a structure, one of the two conductive layers is made of a low-resistivity metal in order to reduce delay of the signals or voltage drop in the data lines 171 and the drain electrodes 175. Also in a multi-layered structure, another conductive layer is made of a material having prominent physical, chemical, and electrical contact properties with ITO, IZO, and particularly, organic semiconductors. Besides the materials described above, various metals and conductors and combinations thereof can be used to form the data lines 171 and the drain electrodes 175.

All lateral sides of the data lines 171 and the drain electrodes 175 preferably slope between about 30° and about 80° relative to the surface of the substrate 110.

A plurality of island-shaped organic semiconductors 154 are formed on the data lines 171, the drain electrodes 175, and the gate insulating layer 140, such as including the portions of the gate insulating layer 140 exposed between the drain electrodes 175 and the source electrodes 173. Each organic semiconductor 154 is formed above the gate electrode 124, and is in contact with a source electrode 173 and a drain electrode 175.

The organic semiconductors 154 may be made of a polymer or an oligomer, which have a conjugated structure that can facilitate mobility of electrons. The organic semiconductors 154 may also be made of a low molecular compound or a high molecular compound that is soluble in aqueous solutions and organic solvents. In a solution process, a low molecular compound with very low solubility may be used with a derivative with a hydrophilic reactive radical or a hydrophobic reactive radical.

For example, the organic semiconductors 154 are made of one selected from a derivative containing a substituent of tetracene or pentacene, oligothiophene in which 4, 5, 6, 7, or 8 thiophene rings are connected to each other at the position of 2 or 5, polythienylenevinylene, poly 3-hexylthiophene, phthalocyanine, and thiophene.

The organic semiconductors 154 may also be made of a photosensitive organic material. A layer of such a material can have a predetermined pattern with semiconductor properties after being exposed to light. More specifically, an organic compound, in which a moiety, a specific segment of the molecular structure, that exhibits the semiconductor properties, and an acid-liable group, that is decomposed when being exposed to light under a specific condition, exist together in its molecular structure, and can be used to form the organic semiconductors 154. In the case when such a compound is exposed to light in the presence of a photo-acid generator, the acid-liable group of the compound is decomposed by an acid-catalyst ($H^+$) emerging from the photo-acid generator, and an organic material with semiconductor properties is produced with the decomposition to form the organic semiconductors 154.

During manufacture, as will be further described below, such an organic material is deposited on a partial portion of or the entire substrate 110 by using a technique of evaporation, spin coating, off-set printing, screen printing, micro-contact printing, or inkjet printing, and then is exposed to light, so that organic semiconductors 154 are formed. Here, a layer of organic material with low resolution, which is formed by a comparably simple method such as spin coating or any printing technique, is patterned only by photolithography without an additional process, thereby changing it into a plurality of organic semiconductors 154 with high resolution.

A gate electrode 124, a source electrode 173, a drain electrode 175, and an organic semiconductor 154 form a thin film transistor ("TFT"). A TFT channel is formed in the organic semiconductor 154 that is placed between the source electrode 173 and the drain electrode 175, above the gate electrode 124.

A plurality of insulating patterns 164 are formed on the respective organic semiconductors 154. The insulating patterns 164 are made of parylene, poly vinyl alcohol ("PVA"), or a fluoride-based hydrocarbon compound, to protect the organic semiconductors 154 from high temperature, plasma, and chemical materials that will be applied in succeeding processes.

A passivation layer 180 is formed on the data lines 171, the drain electrodes 175, and the insulating patterns 164, and may be further formed on exposed portions of the gate insulating layer 140 as shown in FIG. 2. The passivation layer 180 may be made of an inorganic insulator such as $SiN_x$ or $SiO_2$, an organic insulator such as polyimide or polyacryl, or a low dielectric insulator having a dielectric constant below 4.0. Desirable examples of the low dielectric insulator are a-Si:C:O, a-Si:O:F, etc., produced by plasma enhanced chemical vapor deposition ("PECVD"). However, the passivation layer 180 may be configured as a double-layered structure including a lower inorganic insulator layer and an upper organic insulator layer. This structure has a good insulating property, and protects the exposed semiconductors 154 from damage. In alternative embodiments, the passivation layer 180 may be omitted.

The passivation layer 180 is provided with a plurality of contact holes 182 and 185, through which the end portions 179 of the data lines 171 and the drain electrodes 175 are exposed, respectively. The contact holes 185 may be formed in an extension portion of the drain electrodes 175. A plurality of contact holes 181 are formed in the passivation layer 180 and the gate insulating layer 140, and the end portions 129 of the gate lines 121 are exposed through the contact holes 181.

A plurality of pixel electrodes 191 and a plurality of contact assistants 81 and 82 are formed on the passivation layer 180. The pixel electrodes 191 and the contact assistants 81 and 82 are made of a transparent conductor such as IZO or ITO, or an opaque reflective conductor such as Al, Ag, or any of their alloys.

The pixel electrodes 191 are physically and electrically connected to the drain electrodes 175 through the contact holes 185 in order to receive the data voltages from the drain electrodes 175. The pixel electrodes 191 are supplied with the data voltages and generate electric fields in cooperation with a common electrode (not shown) of a different panel (not shown) opposing the TFT array panel. The electric fields generated between the pixel electrodes 191 and the common electrode determine the orientations of liquid crystal ("LC") molecules in an LC layer (not shown) interposed between the pixel electrodes 191 and the common electrode. Each set of a pixel electrode 191 and the common electrode forms an LC capacitor that is capable of storing the applied voltage after the TFT is turned off, such as when the gate lines 121 deliver an OFF signal to the TFTs via the gate electrodes 124.

Each pixel electrode 191 may be partially overlapped, as illustrated, with an adjacent gate line 121 and an adjacent data line 171 to increase the aperture ratio.

The contact assistants 81 and 82 are connected to the end portions 129 of the gate lines 121 and the end portions 179 of the data lines 171 through the contact holes 181 and 182, respectively. The contact assistants 81 and 82 supplement adhesion between the exposed end portions 129 and 179 and exterior devices, and further serve to protect the end portions 129, 179.

Hereinafter, an exemplary method of manufacturing the exemplary organic TFT array panel shown in FIG. 1 and FIG. 2 will be described with reference to FIG. 3 through FIG. 13, as well as with reference to FIG. 1 and FIG. 2.

Figure 3:
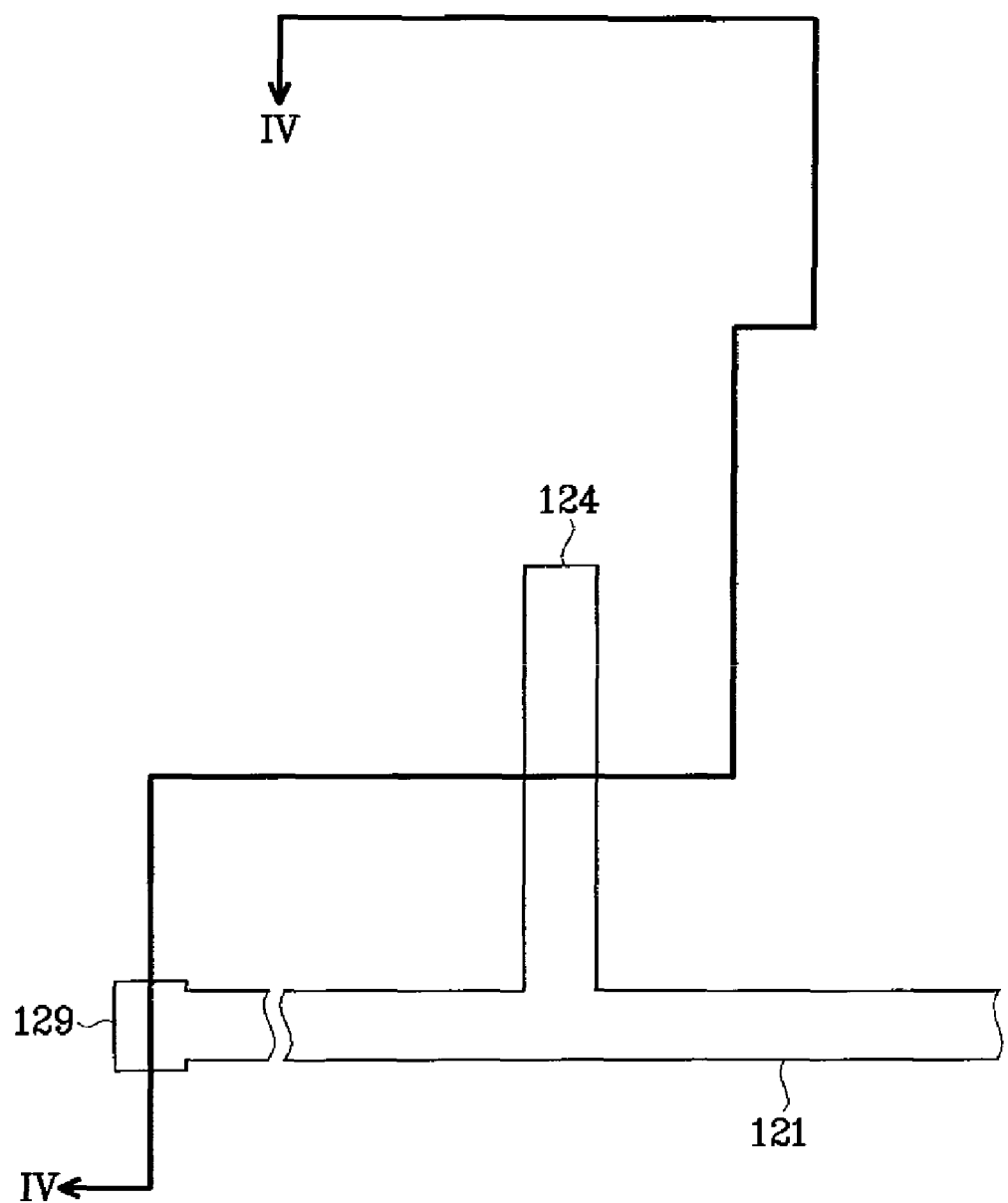
FIG. 3, FIG. 5, FIG. 8, FIG. 10, and FIG. 12 are layout views for explaining exemplary intermediate process steps to manufacture the exemplary organic TFT array panel shown in FIG. 1 and FIG. 2.
Figure 4:
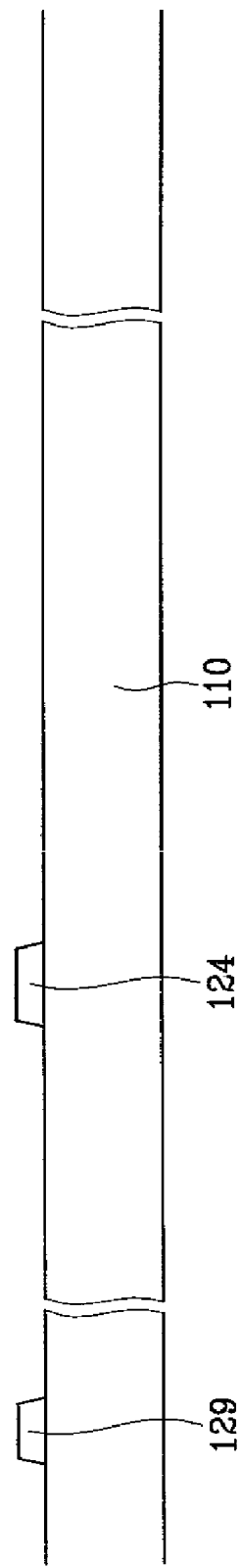
FIG. 4 is a schematic cross-sectional view cut along line IV-IV of FIG. 3.
Figure 5:
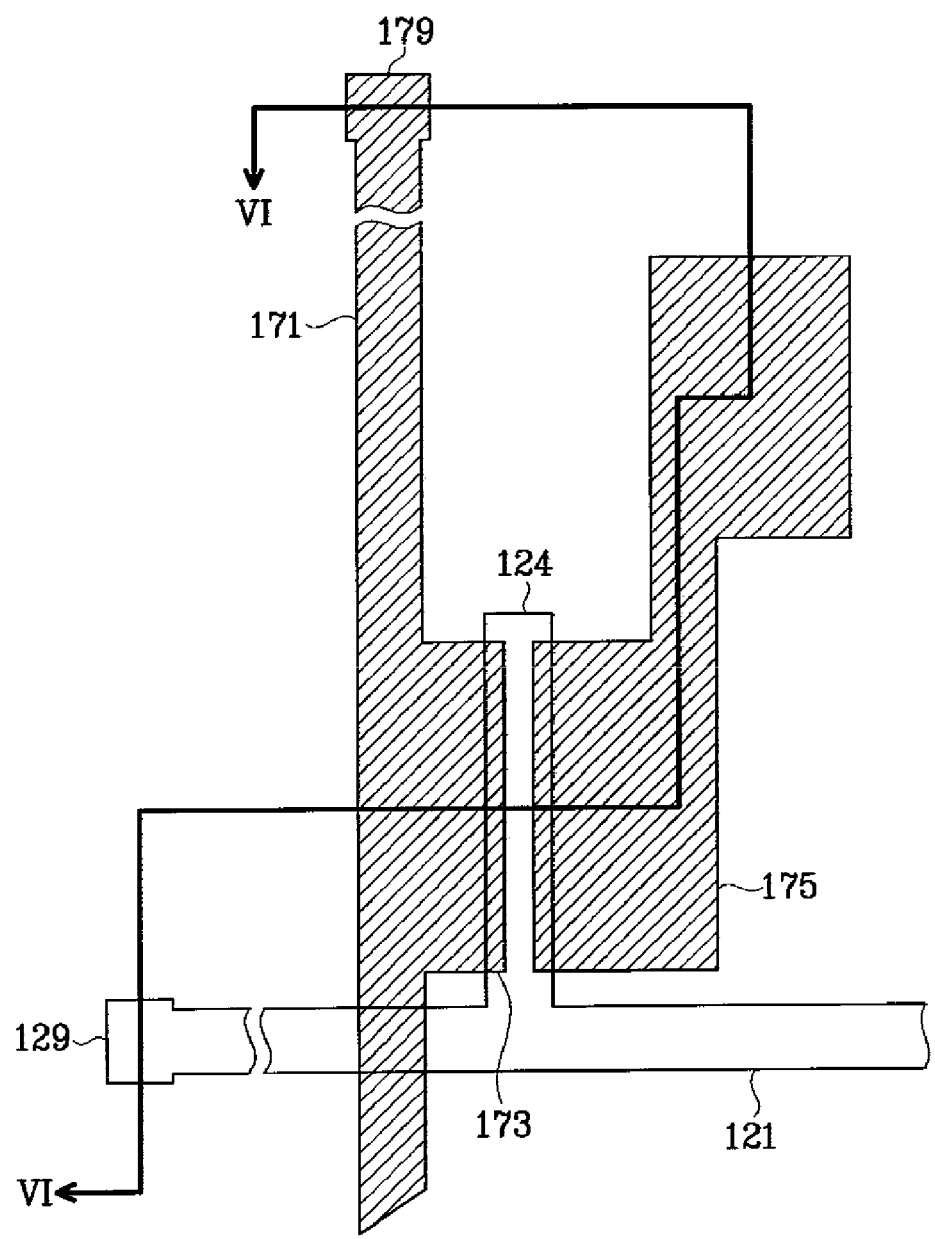
Figure 7:
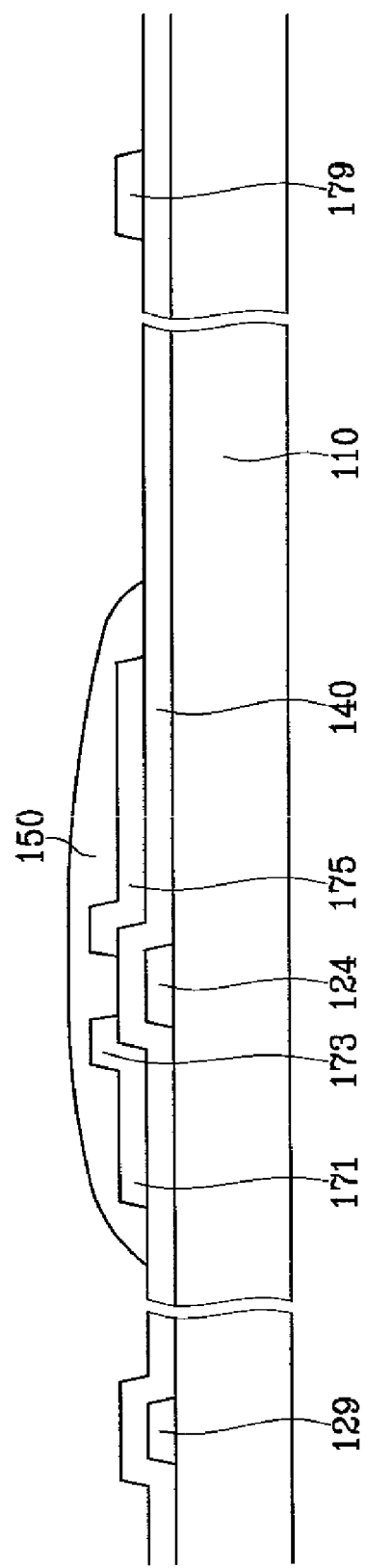
FIG. 7 is a schematic cross-sectional view illustrating an exemplary step that follows the exemplary step shown in FIG. 6.
Figure 8:
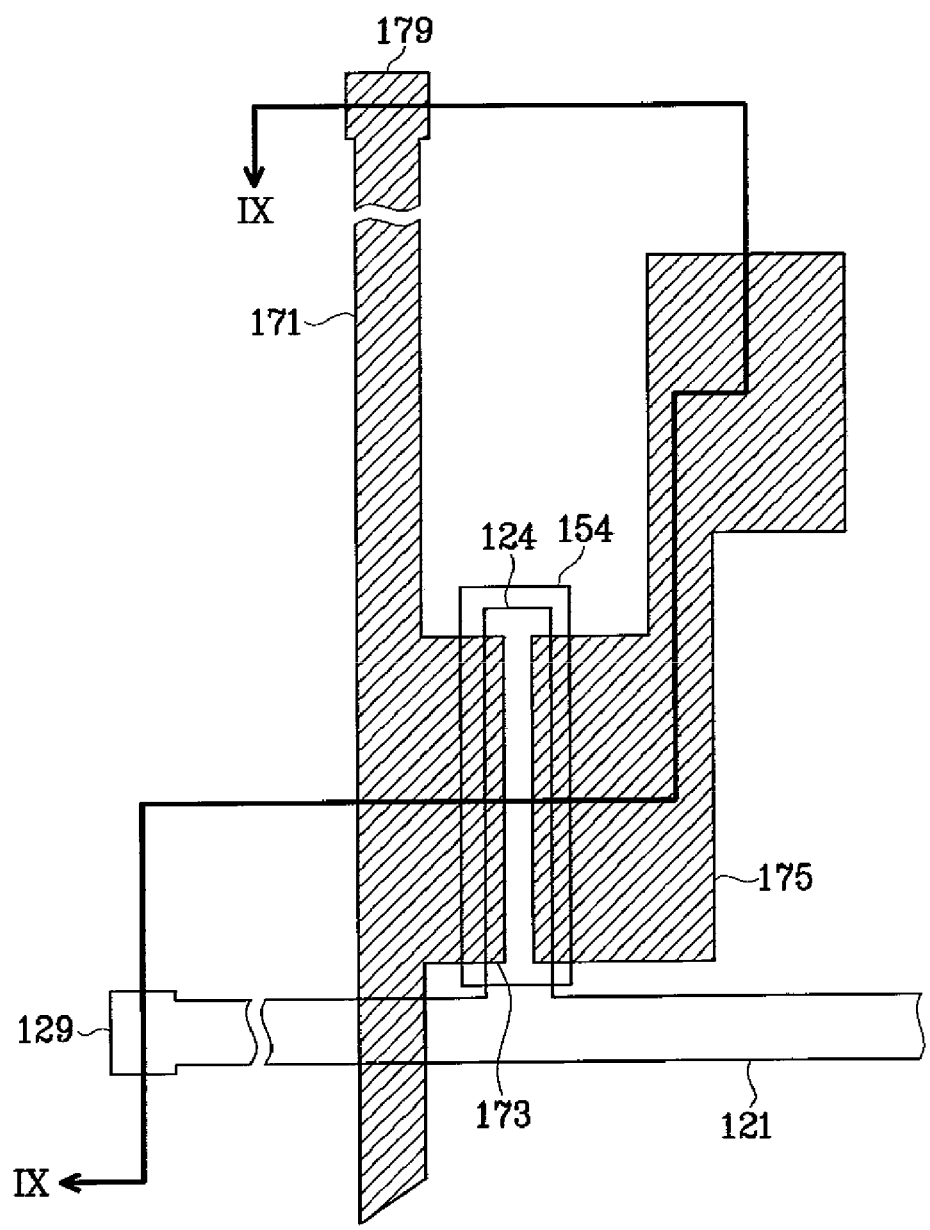
Figure 9:
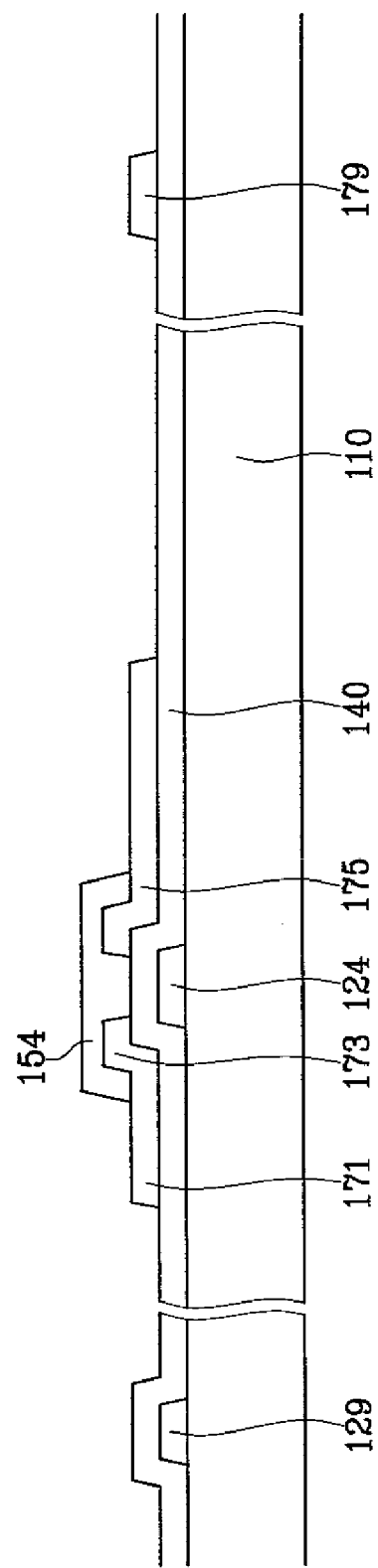
FIG. 9 is a schematic cross-sectional view cut along line IX-IX of FIG. 8.
Figure 10:
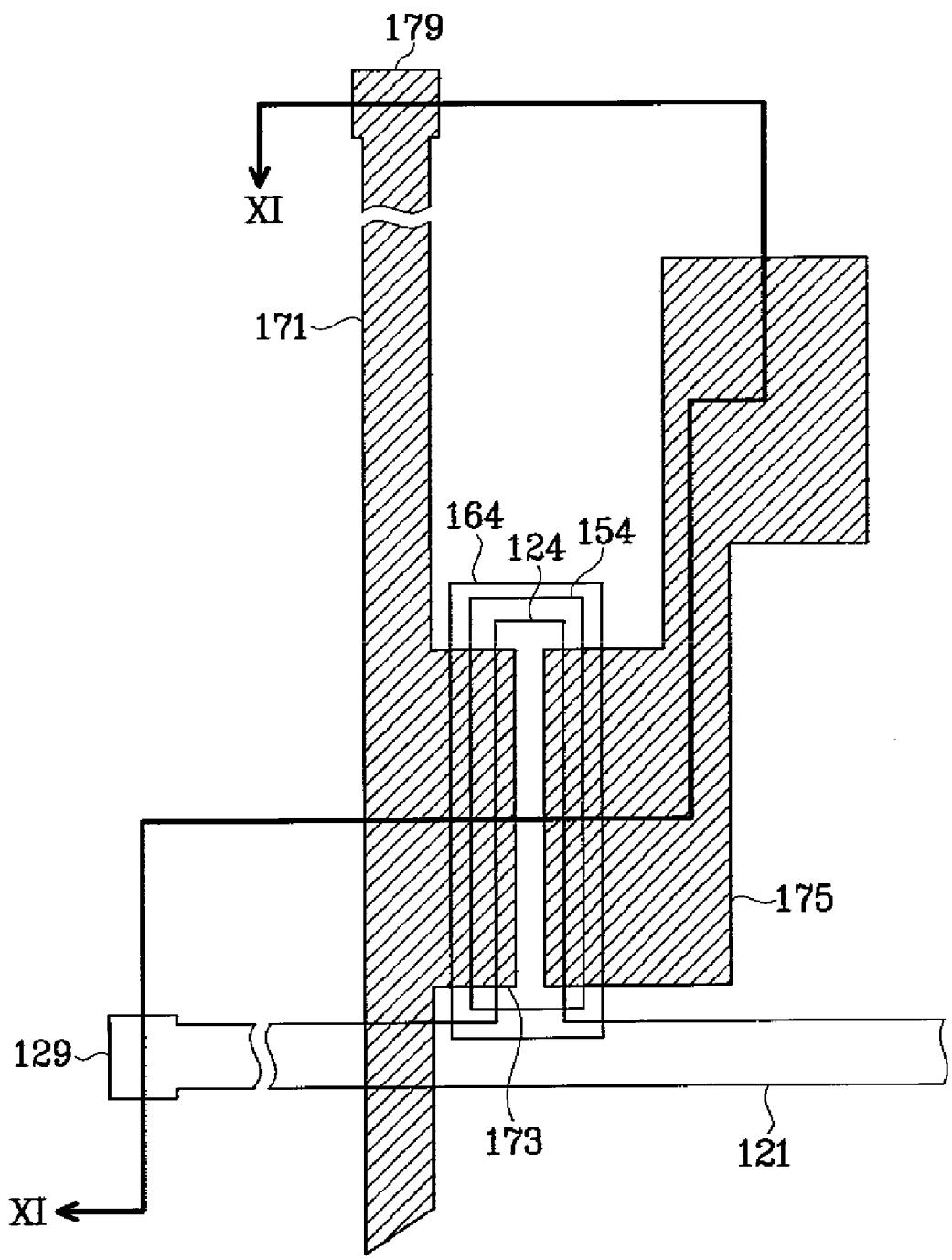
Figure 11:
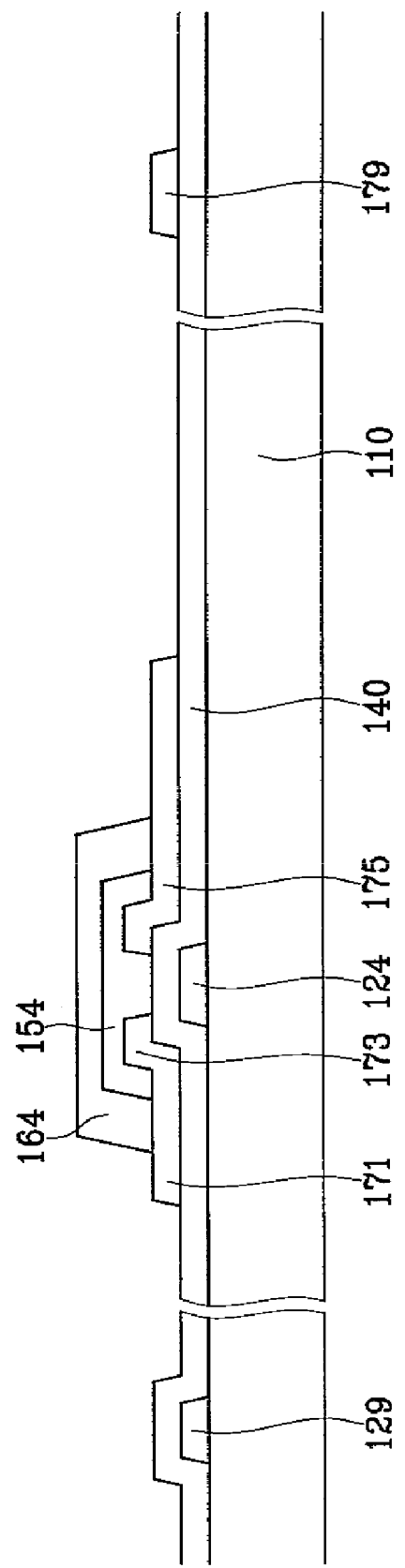
FIG. 11 is a schematic cross-sectional view cut along line XI-XI of FIG. 10.

FIG. 3, FIG. 5, FIG. 8, FIG. 10, and FIG. 12 are layout views for explaining exemplary intermediate process steps to manufacture the exemplary organic TFT array panel shown in FIG. 1 and FIG. 2. FIG. 4 is a schematic cross-sectional view cut along line IV-IV FIG. 3, FIG. 6 is a schematic cross-sectional view cut along line VI-VI of FIG. 5, FIG. 7 is a schematic cross-sectional view for illustrating an exemplary step that follows the exemplary step shown in FIG. 6, FIG. 9 is a schematic cross-sectional view cut along line IX-IX of FIG. 8, FIG. 11 is a schematic cross-sectional view cut along line XI-XI of FIG. 10, and FIG. 13 is a schematic cross-sectional view cut along line XIII-XIII of FIG. 12.

First, a plurality of gate lines 121 with gate electrodes 124 and end portions 129 are formed on an insulating substrate 110 made of transparent glass or plastic, as shown in FIG. 3 and FIG. 4.

Figure 6:
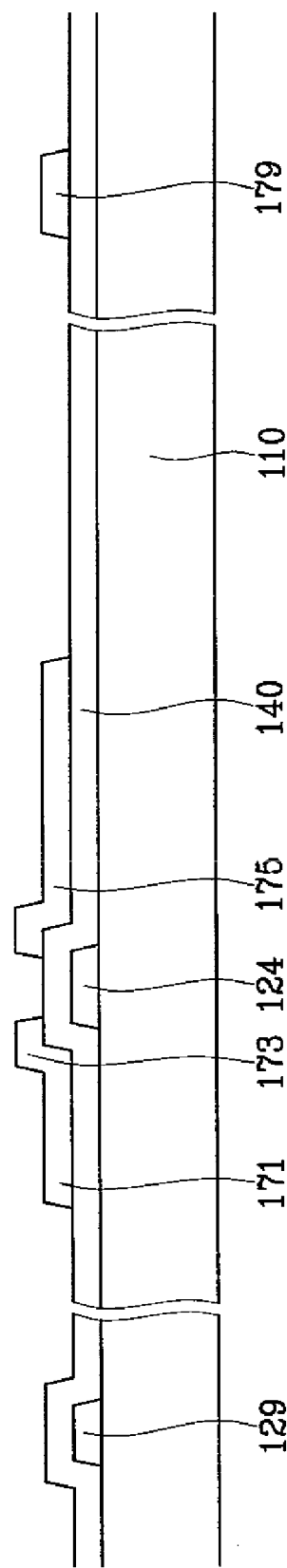
FIG. 6 is a schematic cross-sectional view cut along line VI-VI of FIG. 5.

Next, a gate insulating layer 140 is formed on the entire substrate 110, including the portions covered by the gate lines 121, end portions 129, and gate electrodes 124 by a CVD process, as shown in FIG. 5 and FIG. 6. The gate insulating layer 140 may have a thickness of 500 Å to 3000 Å, and may be surface-treated with an OTS solution.

Then, a low-resistivity conductor such as, but not limited to, Au is deposited on the gate insulating layer 140. The deposited layer is patterned by photolithography, so that a plurality of data lines 171 with source electrodes 173 and end portions 179, and a plurality of drain electrodes 175 are formed on the gate insulating layer 140.

Subsequently, as shown in FIG. 7, an organic layer 150 is formed to fully or partially cover the data lines 171 and the drain electrodes 175. The organic layer 150 is made of a photosensitive organic compound that includes a moiety, that exhibits semiconductor properties, and an acid-liable group, that is decomposable when exposed to light under a specific condition. More specifically, a pentacene derivative with a t-butyloxycarbonyl (t-BOC) group in its molecular structure may be used to form the organic layer 150. The pentacene derivative can be obtained from a reaction between pentacene and N-sulfinyl-tert-butylcarbamate in the presence of a catalyst of palladium. Such a reaction bonds the t-butyloxycarbonyl (t-BOC) group to the pentacene structure by a Diels-Alder reaction.

The pentacene derivative can be deposited by using various techniques, such as evaporation, spin coating, off-set printing, screen printing, micro-contact printing, or inkjet printing.

Next, the deposited layer is exposed to UV light in the presence of a photo-acid generator such as di-tert-butyl-phenyliodonium, and then a thermal treatment is performed at 110° C. to 150° C. for 5 minutes. At this time, the t-BOC group of the pentacene derivative is decomposed by hydrogen emerging from the photo-acid generator, thereby forming a plurality of organic semiconductors 154 formed of pentacene, as shown in FIG. 8 and FIG. 9.

Next, an insulating layer including parylene, poly vinyl alcohol, or a fluoride-based hydrocarbon compound, is formed on the substrate 110, at least in an area overlying the organic semiconductors 154, by a dry process that is performed at a low temperature. The insulting layer is then patterned by photolithography, thereby forming a plurality of insulating patterns 164 that fully cover the respective organic semiconductors 154, as shown in FIG. 10 and FIG. 11. Each insulating pattern 164 may also overly portions of the gate insulating layer 140, the source electrode 173, and the drain electrode 175 adjacent to the covered organic semiconductor 154.

Figure 12:
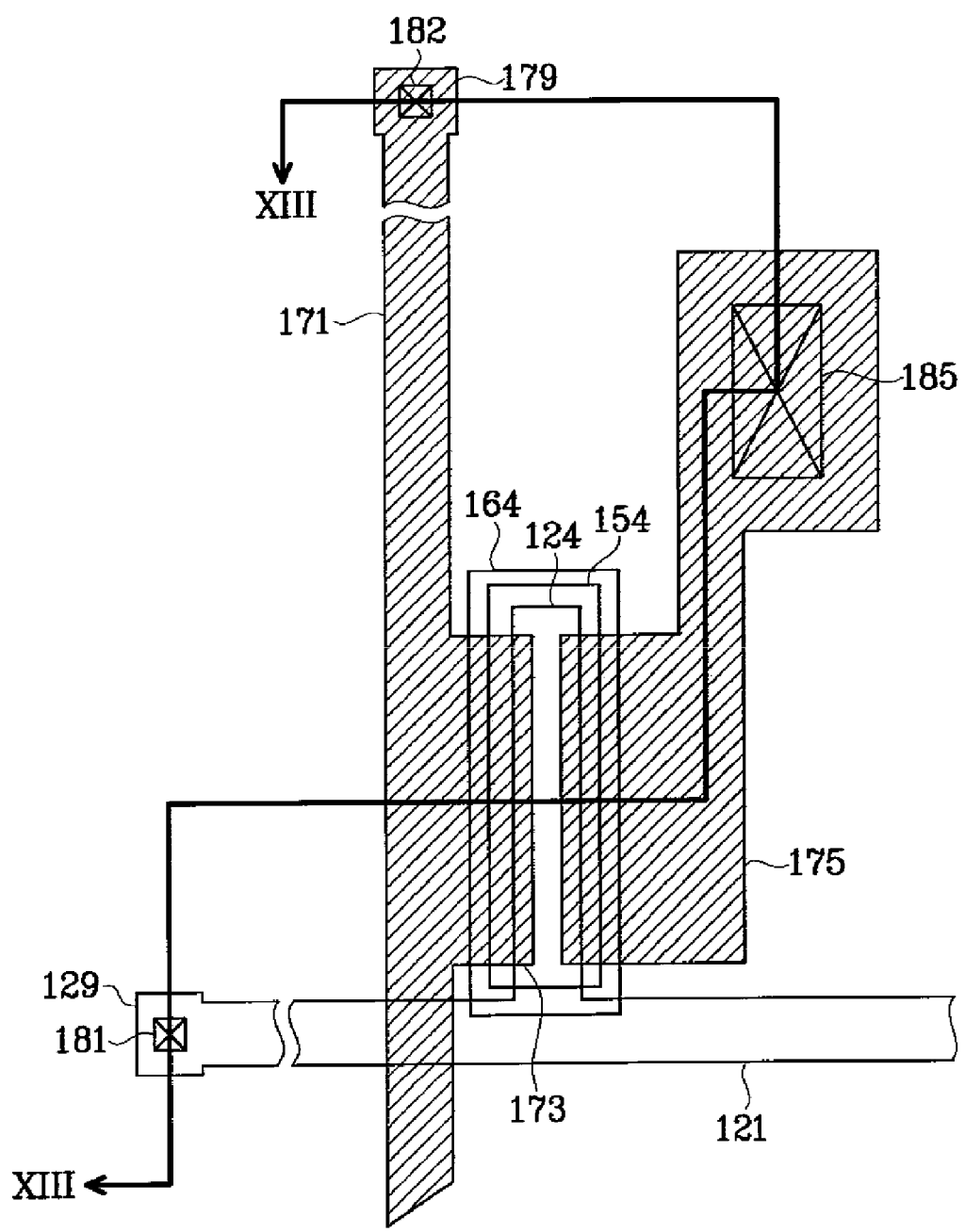
Figure 13:
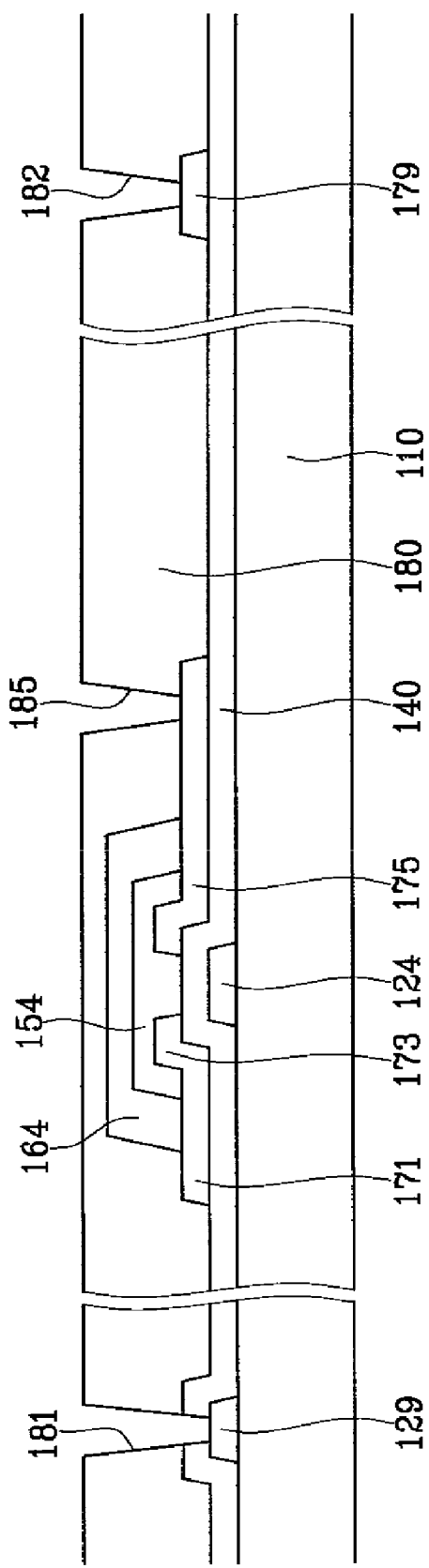
FIG. 13 is a schematic cross-sectional view cut along line XIII-XIII of FIG. 12.

Subsequently, as shown in FIG. 12 and FIG. 13, a passivation layer 180 is formed on the data lines 171, the drain electrodes 175, and the insulating patterns 164, as well as exposed portions of the gate insulating layer 140, and is then patterned to form a plurality of contact holes 181, 182, and 185 therein, through which the end portions 129 of the gate lines 121, the end portions 179 of the data lines 171, and the drain electrodes 175 are partially exposed, respectively.

Lastly, a plurality of pixel electrodes 191 and a plurality of contact assistants 81 and 82 are formed on the passivation layer 180, as shown in FIG. 1 and FIG. 2.

Hereinafter, the structure of an exemplary organic TFT array panel according to another exemplary embodiment of the present invention will be described with reference to FIG. 14 and FIG. 15.

Figure 14:
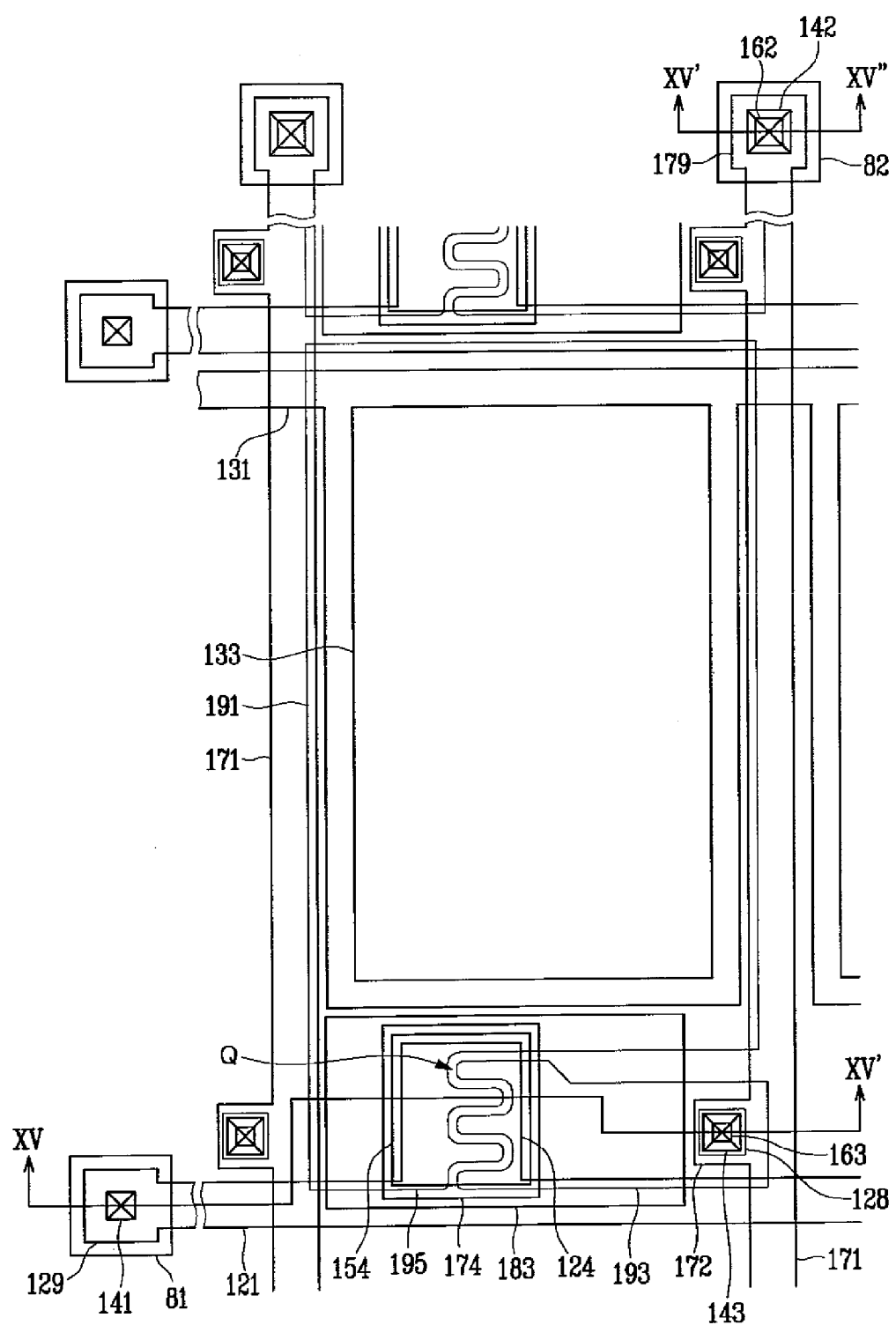
FIG. 14 is a layout view of an exemplary organic TFT array panel according to another exemplary embodiment of the present invention.
Figure 15:
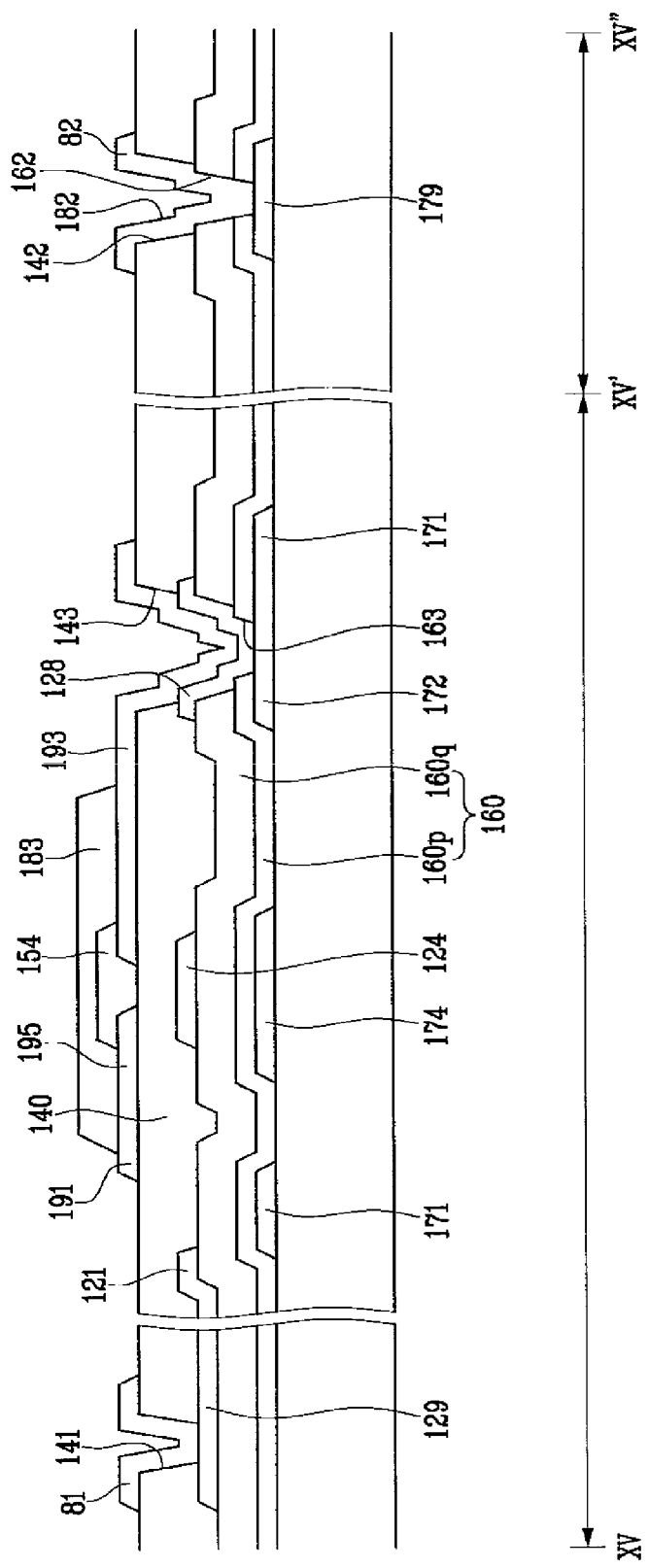
FIG. 15 shows schematic cross-sectional views cut along line XV-XV' and line XV'-XV" of FIG. 14.

FIG. 14 is a layout view of an exemplary organic TFT array panel according to another exemplary embodiment of the present invention, and FIG. 15 shows schematic cross-sectional views cut along line XV-XV' and line XV'-XV" of FIG. 14.

Referring to FIG. 14 and FIG. 15, a plurality of data lines 171 and a plurality of light-blocking members 174 are formed on an insulating substrate 110 made of transparent glass or plastic.

The data lines 171 for transmitting data signals extend substantially in a second direction, such as a vertical direction. Each data line 171 includes a plurality of projections 172 and an end portion 179 that has a large area for contact with another layer or an external driving circuit. The projections 172 project from the data lines 171 in an angular direction to the second direction, such as in a first direction substantially perpendicular to the second direction. The data lines 171 and the light-blocking members 174 may be made of a low-resistivity metal such as Au, Ag, Cu, or Al, or any of their alloys, in order to reduce delay of the signals or voltage drop in the data lines 171 and the light-blocking members 174. They may also be configured as a multi-layered structure including at least two conductive layers having different physical properties. In such a structure, one of the two layers is made of a low-resistivity conductor, while another conductive layer is made of a conductor such as Mo, a Mo alloy (for example, MoW), or Cr, which has good physical, chemical, and electrical contact properties with ITO and IZO. Besides the materials described above, various metals and conductors and combinations thereof can be used to form the data lines 171 and the light blocking members 174.

The data lines 171 and the light-blocking members 174 are formed to have a thickness of 1000 Å to 3000 Å.

All lateral sides of the data lines 171 and the light-blocking members 174 preferably slope between about 30° and about 80° relative to the surface of the substrate 110.

A first interlayer insulating layer 160$p$ is formed on the data lines 171 and the light-blocking members 174. The first interlayer insulating layer 160$p$ may further be formed on exposed portions of the substrate 110. The first interlayer insulating layer 160$p$ is made of an inorganic insulator such as, but not limited to, $SiN_x$ or $SiO_2$.

A second interlayer insulating layer 160$q$ is formed on the first interlayer insulating layer 160$p$. The second interlayer insulating layer 160$q$ is made of an organic insulator including at least one of polyacryl, polyimide, and benzocyclobutyne ($C_{10}H_8$), which have good durability. In an alternative embodiment, either of the two interlayer insulating layers 160$p$ and 160$q$ may be omitted.

A plurality of contact holes 162 and 163 are formed in the interlayer insulating layers 160, and the projections 172 and the end portions 179 of the data lines 171 are partially exposed through the contact holes 163 and 162.

A plurality of gate lines 121, a plurality of contact patterns 128, and a plurality of storage electrode lines 131 are formed on the second interlayer insulating layer 160$q$.

The gate lines 121 for transmitting gate signals extend substantially in a first direction, such as a horizontal direction, to cross the data lines 171. The first direction may be substantially perpendicular to the second direction. Each gate line 121 includes a plurality of gate electrodes 124 protruding upward, such as protruding in the second direction. An end portion 129 of each gate line 121 is more widely formed than other portions of the gate line 121 for good contact with an external device or a different layer.

The contact patterns 128 are connected to the data lines 171 through the contact holes 163 that are formed in the interlayer insulating layers 160, for a purpose as will be further described below.

The storage electrode lines 131 extend substantially in the first direction, such as a horizontal direction, and thus may extend substantially parallel to the gate lines 121. Each storage electrode line 131 includes a plurality of storage electrodes 133. Each storage electrode 133 includes two vertical lines that extend downward from the storage electrode line 131, in the second direction, and are placed between two adjacent data lines 171, and a horizontal line, extending in the first direction, that connects both ends of the two vertical lines and is placed above the gate line 121. In other words, the storage electrode 133 is formed within each pixel region defined by intersecting pairs of gate lines 121 and data lines 171.

The gate lines 121, the contact patterns 128, and the storage electrode lines 131 may be made of a low-resistivity metal such as Au, Ag, or Al, or any of their alloys, in order to reduce delay of the signals or voltage drop in the gate lines 121, the contact patterns 128, and the storage electrode lines 131. They may also be configured as a multi-layered structure including at least two conductive layers having different physical properties. In such a structure, one of the two layers is made of a low-resistivity conductor, while another layer is made of a conductor such as Mo, a Mo alloy (for example, MoW), or Cr, which has good physical, chemical, and electrical contact properties with other materials such as ITO and IZO. Besides the materials described above, various metals and conductors and combinations thereof can be used to form the gate lines 121, the contact patterns 128, and the storage electrode lines 131.

The gate lines 121, the contact patterns 128, and the storage electrode lines 131 preferably slope between about 30° and about 80° relative to the surface of the substrate 110.

A gate insulating layer 140 is formed on the entire substrate 110 with the gate lines 121, the contact patterns 128, and the storage electrode lines 131 formed thereon, and thus the gate insulating layer 140 may further be formed on the second interlayer insulating layer 160$q$ as illustrated in FIG. 15. The gate insulating layer 140 may be made of an inorganic insulator such as $SiN_x$ or an organic insulator. Preferably, the gate insulating layer 140 is made of an organic insulator, such as $SiO_2$ that is surface-treated with octadecyltrichlorosilane ("OTS"), parylene that is achieved from a vacuum chamber of a chemical vapor deposition ("CVD") process, or a hydrocarbon-based high molecular compound containing fluorine (F).

The gate insulating layer 140 made of parylene exhibits good insulation properties because parylene has a very low dielectric constant. Parylene is very uniformly deposited over the entire area of the substrate 110 having the elements formed thereon as described above. In this case, the thickness of a parylene layer can range from 1000 Å to several micrometers. In addition, parylene polymers are insoluble in all organic solvents in existence. Since a parylene deposition process is performed at room temperature, the parylene layer undergoes no heat stress during the process. Moreover, etching of the parylene layer is eco-friendly performed because dry etching uses no solvent.

The gate insulating layer 140 has a thickness of about 6000 Å to 1.2 μm.

A plurality of contact holes 141 and 142 are formed in the gate insulating layer 140, and the end portions 129 of the gate lines 121 and the end portions 179 of the data lines 171 are at least partially exposed through the contact holes 141 and 142, respectively. A plurality of contact holes 143 are also formed in the gate insulating layer 140. Each contact hole 143 is aligned with a contact hole 163 formed in the interlayer insulating layers 160, and projections 172 of the data lines 171, which are adjacent to the gate electrodes 124, may be partially exposed through the contact holes 143 and the contact holes 163. Alternatively, the contact pattern 128, formed in the contact hole 163 and contacting the projection 172, is exposed by the contact hole 143.

In one exemplary embodiment, the end portions 129 of the gate lines 121 and the end portions 179 of the data lines 171 are connected to external driving circuits mounted on the substrate 110 in the form of IC chips, through the contact holes 141 and 142, by using a thin anisotropic conductive film. Alternately, the external driving circuits (particularly, gate driving circuits) may be integrated into the substrate. In this case, the driving circuits are formed on the same layer as the organic TFTs, and the end portions 129 and 179 respectively of the gate lines 121 and the data lines 171 are electrically connected to output terminals of the driving circuits.

A plurality of source electrodes 193, a plurality of pixel electrodes 191, and a plurality of contact assistants 81 and 82 are formed on the gate insulating layer 140. The source electrodes 193, the pixel electrodes 191, and the contact assistants 81 and 82 are made of a transparent conductor such as, but not limited to, IZO or ITO, or a good reflective conductor, and are formed to a thickness of about 300 Å to 800 Å.

The pixel electrodes 191 are partially overlapped with the gate electrodes 124, and the overlap portions of the pixel electrodes 191 become drain electrodes 195. The drain electrodes 195 receive the data signals.

The source electrodes 193 are placed opposite to the drain electrodes 195, spaced from the drain electrodes 195, centering on the gate electrodes 124, and are connected to the data lines 171 through the contact holes 143 and 163.

A partial outline of each source electrode 193, facing the drain electrode 195, is wave-shaped, and a partial outline of the opposite drain electrode 195, facing the source electrode 193, is formed parallel to such an outline of the source electrode 193. In other words, the partial outline of the drain electrode 195 has a wave-shape spaced from but nested within the wave shape of the partial outline of the source electrode 193, such a distance between the source electrode 193 and the drain electrode 195 is substantially consistent. The wave-shaped outlines maximize the length within a given unit area.

Each pixel electrode 191 is partially overlapped with the adjacent gate line 121 and the adjacent data line 171 to increase the aperture ratio. However, such an overlap structure is optional.

The contact assistants 81 and 82 are connected to the end portions 129 of the gate lines 121 and the end portions 179 of the data lines 171 through the contact holes 141 and 142, respectively. The contact assistants 81 and 82 supplement adhesion between the exposed end portions 129 and 179 and exterior devices, and protect the end portions 129 and 179.

The contact patterns 128 are connected to the data lines 171 through the contact holes 163 that are formed in the interlayer insulating layers 160. The contact patterns 128 are also connected to the source electrodes 193 through the contact holes 143 that are formed in the gate insulating layer 140. Since some organic layers, such as the second interlayer insulating layer 160q and the gate insulating layer 140, exist between the data lines 171 and the source electrodes 193, defective contact may occur between the data lines 171 and the source electrodes 193 if the source electrodes 193 were directly connected to the data lines 171. In this case, the contact patterns 128, which are provided between the data lines 171 and source electrodes 193, prevent such a defective contact.

A plurality of island-shaped organic semiconductors 154 are formed on the drain electrodes 195 and the source electrodes 193. Each organic semiconductor 154 is placed in a location substantially centered above a gate electrode 124, and is in contact with a source electrode 193 and a drain electrode 195, such as in an area occupied by the wave-shaped outlines of the source and drain electrodes 193, 195. Each organic semiconductor 154 is also aligned with one of the light-blocking members 174, positioned generally below the gate electrodes 124. In this case, the light-blocking members 174 prevent photoleakage current from abruptly increasing in the organic semiconductors 154.

Each organic semiconductor 154 may be formed of a polymer or an oligomer, which has a conjugated system that is capable of easily transferring electrons. The organic semiconductor 154 may include a low molecular compound or a high molecular compound that is soluble in aqueous solutions and organic solvents. For a low molecular compound with low solubility, derivatives where a hydrophilic or hydrophobic functional group is combined to a conjugated low molecular compound may be used.

Each organic semiconductor 154 may be made of a derivative containing a substituent of tetracene or pentacene, oligothiophene in which 4, 5, 6, 7, or 8 thiophene rings are connected to each other at the position of 2 or 5 thereof, polythienylenevinylene, poly-3-hexylthiophene, phthalocyanine, or thiophene.

The organic semiconductors 154 may also be made of a photosensitive organic material. A layer of such a material can have a predetermined pattern with semiconductor properties after being exposed to light. More specifically, an organic compound, in which a moiety, a specific segment of the molecular structure, that exhibits the semiconductor properties, and an acid-liable group, that is decomposable when being exposed to light under a specific condition, exist together in its molecular structure, and can be used to form the organic semiconductors 154. In the case when such a compound is exposed to light in the presence of a photo-acid generator, the acid-liable group of the compound is decomposed by an acid-catalyst ($H^+$) emerging from the photo-acid generator, and an organic material with semiconductor properties is produced with the decomposition to form the organic semiconductors 154.

During manufacture, such an organic material is deposited on a partial portion of or the entire substrate 110 by using a technique of evaporation, spin coating, off-set printing, screen printing, micro-contact printing, or inkjet printing, and then is exposed to light, so that organic semiconductors 154 are formed. Here, a layer of organic material with low resolution, which is formed by a comparably simple method such as the spin coating or any printing technique, is patterned only by photolithography without an additional process, thereby changing it into a plurality of organic semiconductors 154 with high resolution.

The organic semiconductors 154 are formed to have thickness of 300 Å to 1000 Å.

A gate electrode 124, a source electrode 193, a drain electrode 195, and an organic semiconductor 154 form a TFT. A TFT channel (Q) is formed in the organic semiconductor 154 that is placed between the source electrode 193 and the drain electrode 195. The TFT channel Q may have a wave-shape following the wave-shape of the partial outlines of the source and drain electrodes 193, 195.

A plurality of insulating patterns 183 are formed on the respective organic semiconductors 154. The insulating patterns 183 are made of parylene, poly vinyl alcohol (PVA) or a fluoride-based hydrocarbon compound, to protect the organic semiconductors 154 from high temperature, plasma, and chemical materials in succeeding processes.

Hereinafter, an exemplary method of manufacturing the exemplary organic TFT array panel shown in FIG. 14 and FIG. 15 will be described with reference to FIG. 16 through FIG. 24.

Figure 16:
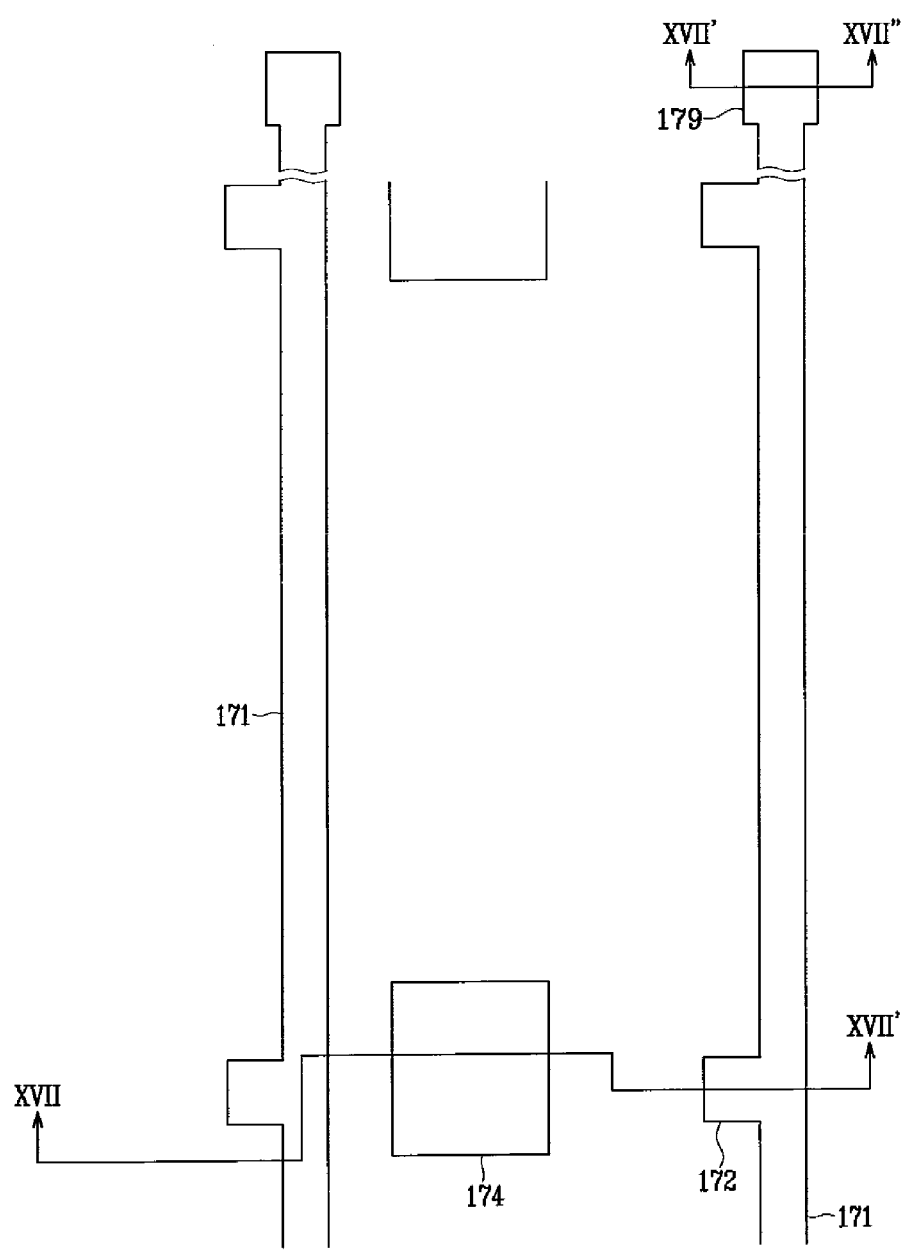
FIG. 16, FIG. 18, FIG. 20, and FIG. 23 are layout views for explaining exemplary intermediate process steps to manufacture the exemplary organic TFT array panel shown in FIG. 14 and FIG. 15.
Figure 17:
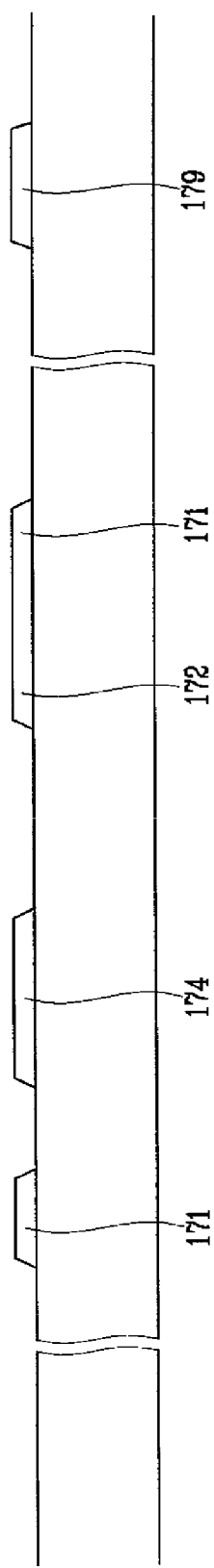
FIG. 17 is a schematic cross-sectional view cut along line XVII-XVII' and line XVII'-XVII" of FIG. 16.
Figure 18:
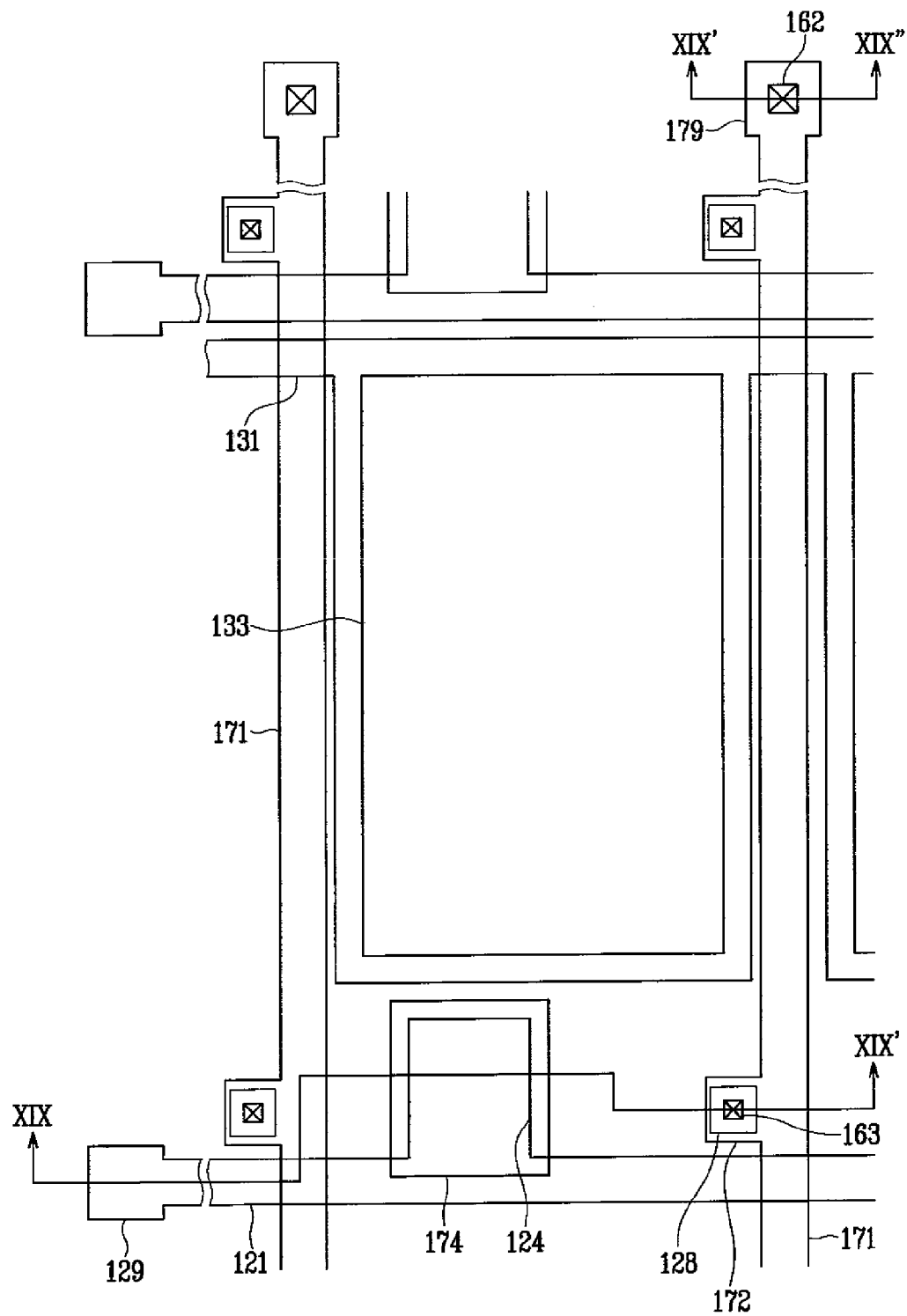
Figure 19:
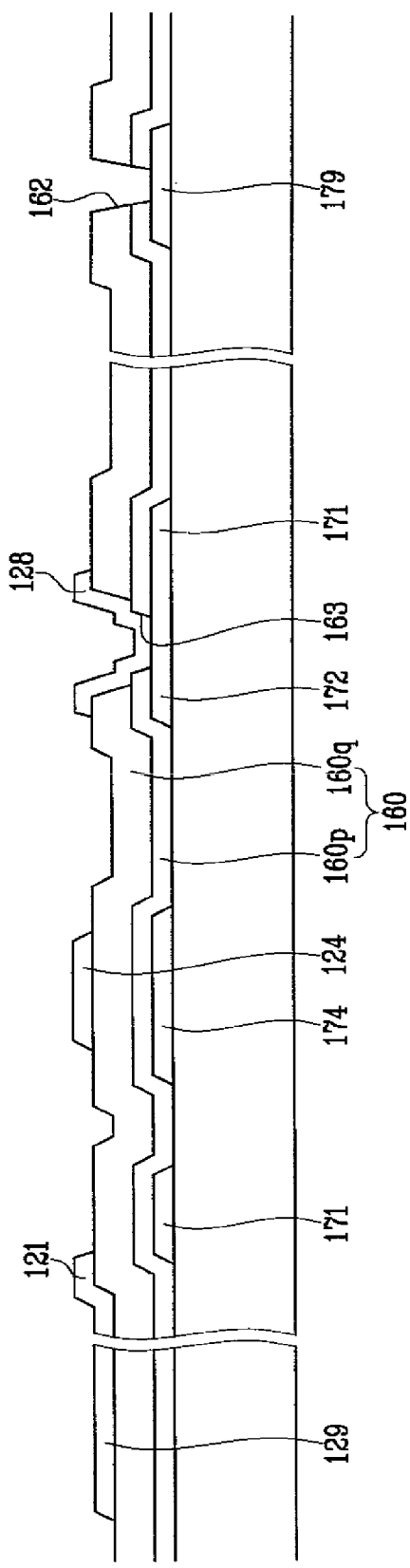
FIG. 19 is a schematic cross-sectional view cut along line XIX-XIX' and line XIX-XIX" of FIG. 18.
Figure 20:
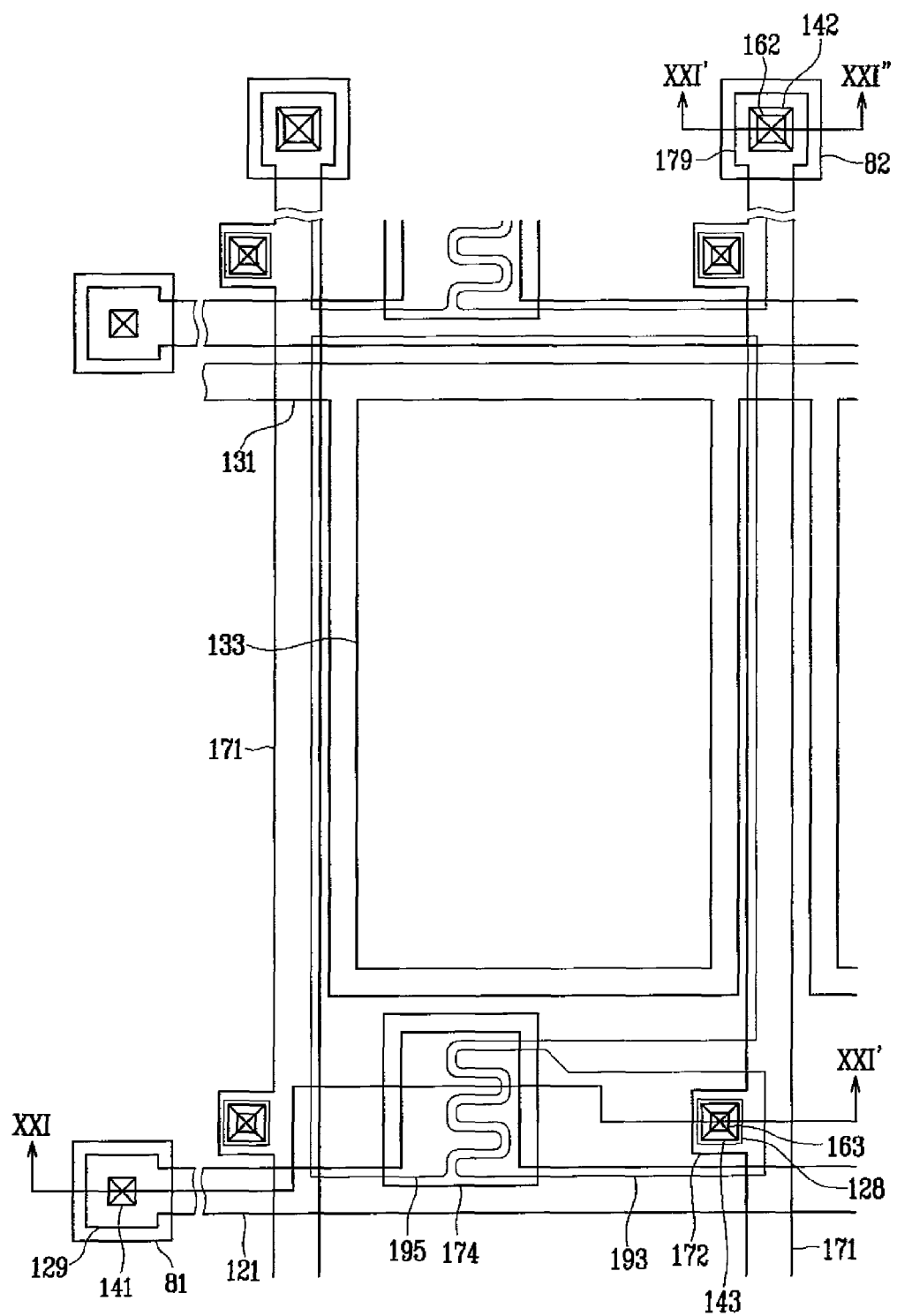
Figure 21:
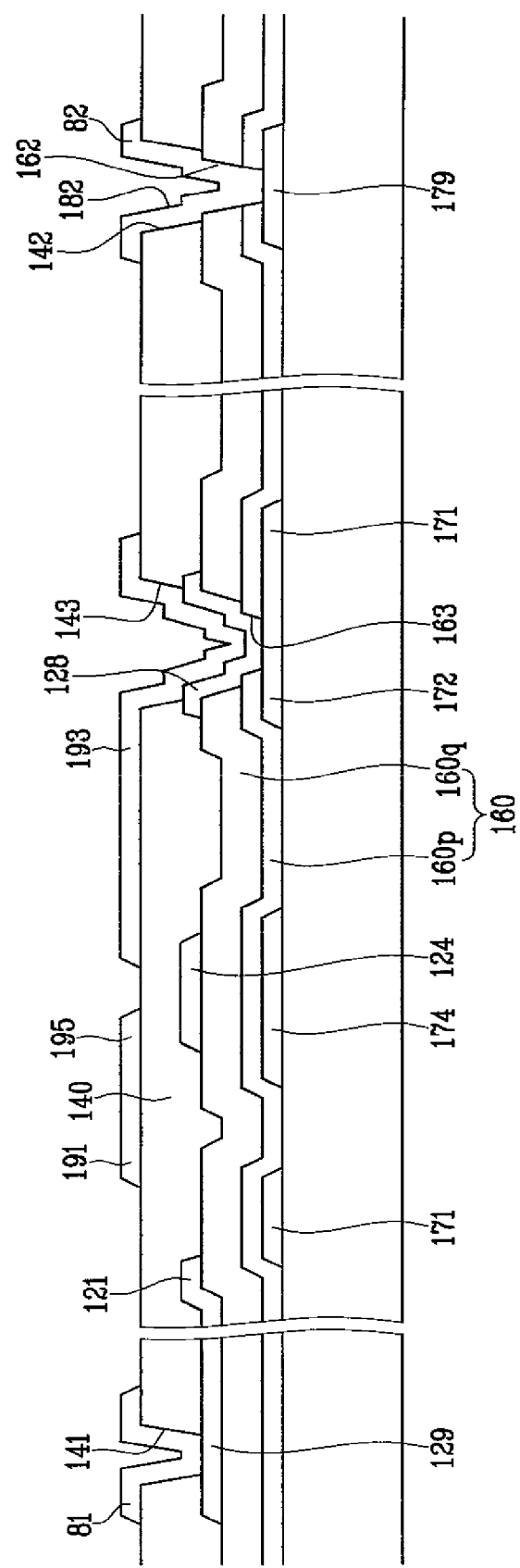
FIG. 21 is a schematic cross-sectional view cut along line XXI-XXI' and line XXI'-XXI" of FIG. 20.
Figure 22:
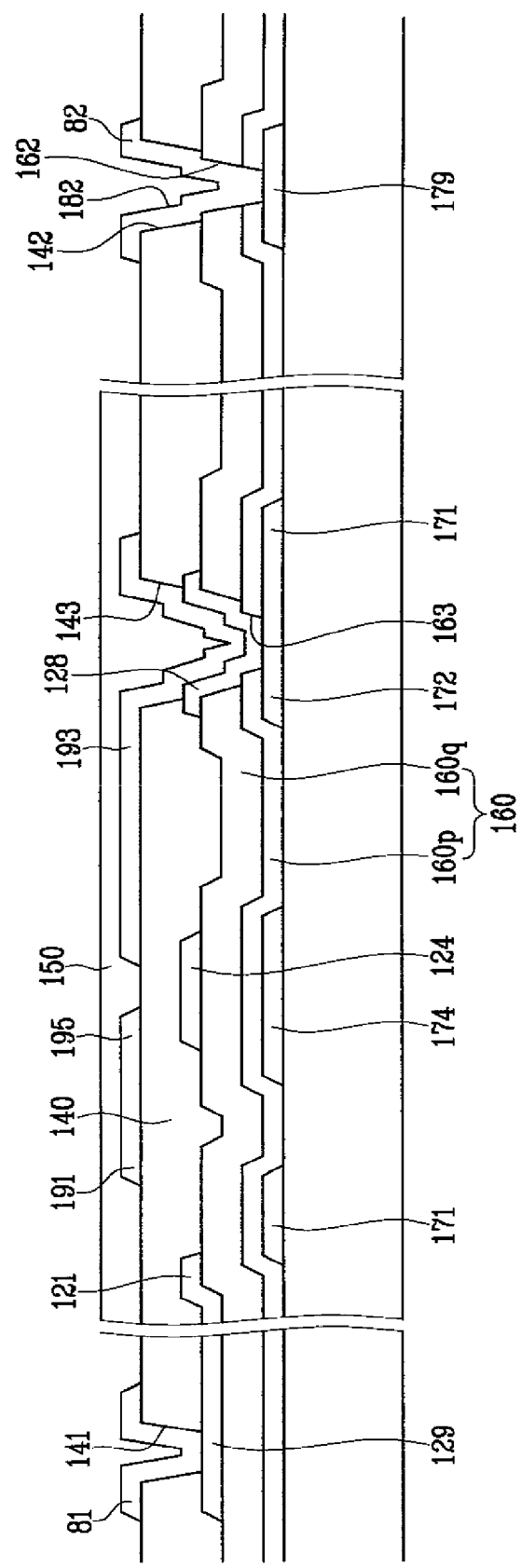
FIG. 22 is a schematic cross-sectional view illustrating an exemplary step following the exemplary step of FIG. 21; and, FIG. 24 is a schematic cross-sectional view cut along line XXIV-XXIV' and line XXIV-XXIV' of FIG. 23.

FIG. 16, FIG. 18, FIG. 20, and FIG. 23 are layout views for explaining exemplary intermediate process steps to manufacture the exemplary organic TFT array panel shown in FIG. 14 and FIG. 15. FIG. 17 is a schematic cross-sectional view cut along line XVII-XVII' and line XVII'-XVII" of FIG. 16, FIG. 19 is a schematic cross-sectional view cut along line XIX-XIX' and line XIX-XIX' of FIG. 18, FIG. 21 is a schematic cross-sectional view cut along line XXI-XIX' and line XXI'-XXI" of FIG. 20, FIG. 22 is a schematic cross-sectional view for explaining an exemplary step following the exemplary step of FIG. 21, and FIG. 24 is a schematic cross-sectional view cut along line XXIV-XXIV' and line XXIV'-XXIV" of FIG. 23.

First, with reference to FIG. 16 and FIG. 17, a metal layer is formed on an insulating substrate 110 made of glass or plastic by a sputtering process. The metal layer may be made of a low-resistivity metal such as Au, Ag, Cu, or Al, or any of their alloys, or may be configured as a multi-layered structure including at least a low-resistivity conductive layer and a conductive layer having good contact properties with other materials.

The metal layer is patterned by photolithography, so that a plurality of data lines 171 with projections 172 and end portions 179, and a plurality of light-blocking members 174 are formed, as shown in FIGS. 16 and 17.

Next, with reference to FIG. 18 and FIG. 19, an inorganic material such as $SiN_x$ is deposited on the entire substrate 110 with the data lines 171 and the light-blocking members 174, so that a first interlayer insulating layer 160p is formed. Subsequently, a photosensitive organic material is deposited on the first interlayer insulating layer 160p, so that a second interlayer insulating layer 160q is formed. The first interlayer insulating layer 160p may be formed at about 250° C. to 400° C. by a CVD process, while the second interlayer insulating layer 160q may be formed by solution process such as spin coating the organic material. In alternative embodiments, either of the two interlayer insulating layers 160p and 160q may be omitted.

Next, the second interlayer insulating layer 160q is selectively exposed to light in order to form a plurality of contact holes 162 and 163, through which portions of the projections 172 and the end portions 179 of the data lines 171 are individually exposed. Subsequent to the formation of the contact holes 162 and 163, a dry etching process for the first interlayer insulating layer 160p is performed using a mask of the second interlayer insulating layer 160q.

Next, a metal layer is formed on the second interlayer insulating layer 160q. The metal layer may be made of Au, Ag, Cu, Al, or any of their alloys, or may be configured as a multi-layered structure including at least a low-resistivity conductive layer and a conductive layer having good contact properties with other materials.

The metal layer is then selectively etched by photolithography, so that a plurality of gate lines 121 with gate electrodes 124, a plurality of contact patterns 128, and a plurality of storage electrode lines 131 with storage electrodes 133 are formed.

With reference to FIG. 20 and FIG. 21, a gate insulating layer 140 is formed on the entire substrate 110 including the gate lines 121, the contact patterns 128, and the storage electrode lines 131. The gate insulating layer 140 is made of an inorganic material or a photosensitive organic material.

Next, the gate insulating layer 140 is selectively exposed to light. As a result, a plurality of contact holes 141, 142, and 143 are formed in the gate insulating layer 140, and the end portions 129 of the gate lines 121, the end portions 179 of the data lines 171, and the contact patterns 128 are exposed through the contact holes 141, 142, and 143, respectively.

Subsequently, amorphous ITO is deposited on the gate insulating layer 140 by a sputtering process. The sputtering process is performed at room temperature. A deposited amorphous ITO layer is patterned using a weak-acid etchant containing amine ($NH_2$), so that a plurality of source electrodes 193, a plurality of pixel electrodes 191 including a plurality of drain electrodes 195, and a plurality of contact assistants 81 and 82 are formed as shown in FIG. 21. While an amorphous ITO layer is described, other transparent conductors or good reflective conductors may also be employed. As mentioned above, the amorphous ITO layer can be etched by the weak-acid etchant, differing from other conductive layers or crystalline ITO layers can be etched only by strong-acid etchants. If a strong-acid etchant is used, the etchant may create cracks in the gate insulating layer 140 by attacking the gate insulating layer 140, and it may even erode different conductive layers underlying the gate insulating layer 140 by soaking through the cracks.

Next, the amorphous ITO layer may be crystallized.

Again, while an amorphous ITO layer has been described, it would also be within the scope of these embodiments to form the source electrodes 193, the pixel electrodes 191, and the contact assistants 81 and 82 from a different transparent conductor such as IZO, or a reflective conductor such as Au or Al, instead of ITO.

With reference to FIG. 22, an organic layer 150 is formed on the entire substrate 110, or substantially the entire substrate 110, with the source electrodes 193 and the pixel electrodes 191. The organic layer 150 is made of a photosensitive organic compound that includes a moiety, a specific segment of the molecular structure, that exhibits semiconductor properties, and an acid-liable group, that is decomposable when being exposed to light under a specific condition. More specifically, a pentacene derivative with a t-butyloxycarbonyl (t-BOC) group in its molecular structures may be used to form the organic layer 150. The pentacene derivative causes a reaction between pentacene and N-sulfinyl-tert-butylcarbamate in the presence of a catalyst of palladium. Such a reaction bonds the t-butyloxycarbonyl (t-BOC) group to the pentacene structure by a Diels-Alder reaction.

The pentacene derivative can be deposited by using a technique of evaporation, spin coating, off-set printing, screen printing, micro-contact printing, or inkjet printing.

Figure 23:
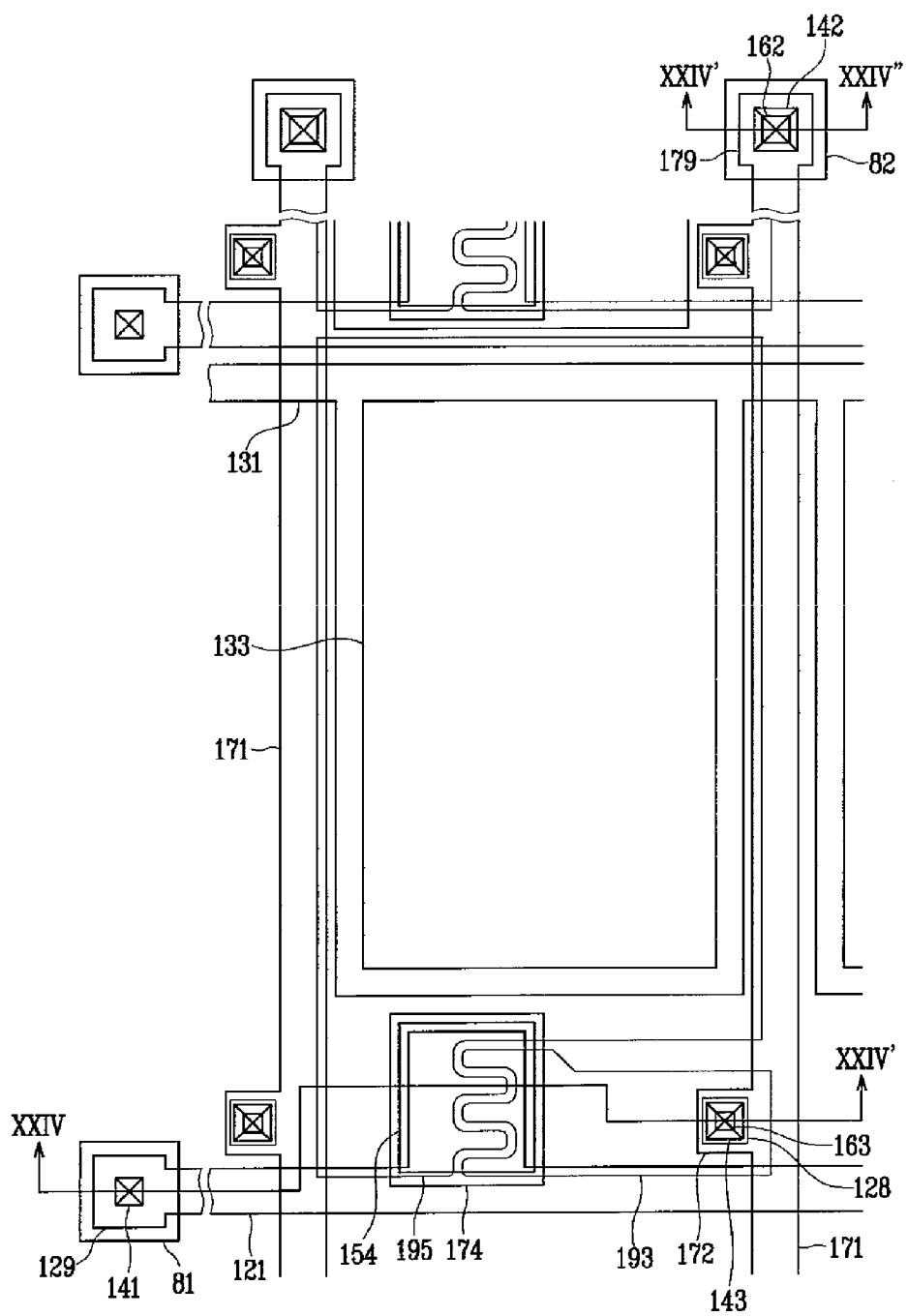
Figure 24:
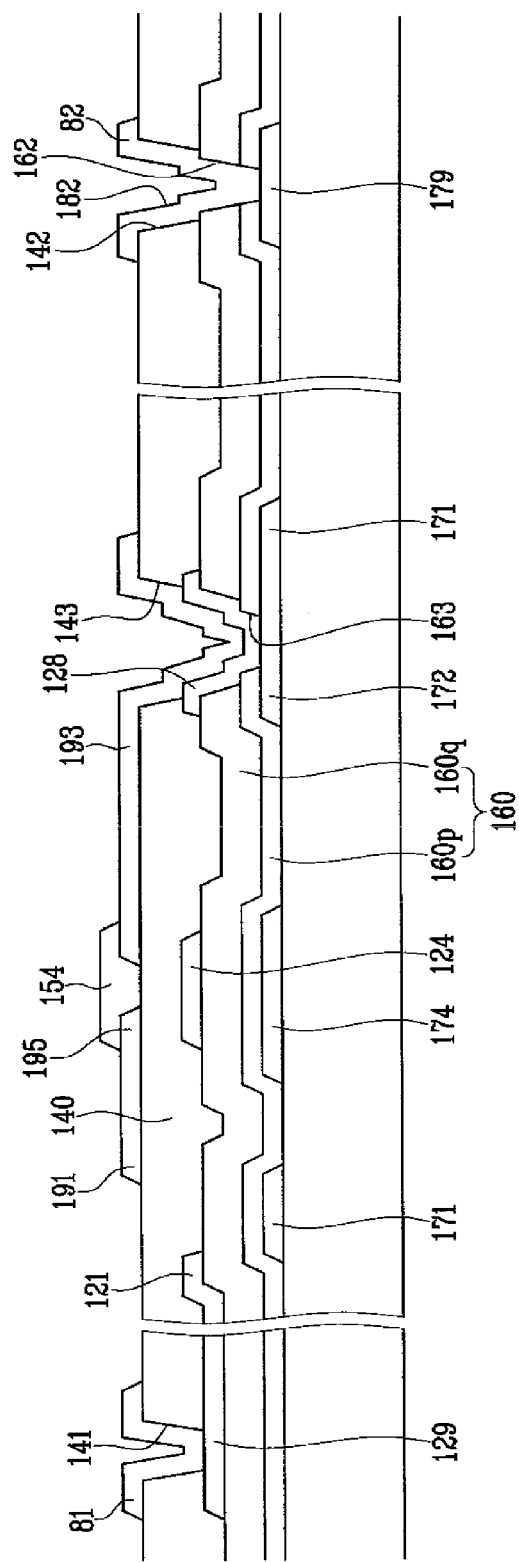

With reference to FIG. 23 and FIG. 24, a layer of the pentacene derivative is exposed to UV light in the presence of a photo-acid generator such as di-tert-butyl-phenyliodonium, and then a thermal treatment is performed at about 110° C. to 150° C. for 5 minutes. At this time, the t-BOC group of the pentacene derivative is decomposed by hydrogen emerging from the photo-acid generator, thereby forming a plurality of organic semiconductors 154 formed of pentacene.

Next, an insulating layer including parylene, poly vinyl alcohol (PVA), or a fluoride-based hydrocarbon compound, is formed on the substrate 110 by a dry process that is performed at a low temperature. The insulating layer is then patterned by photolithography, thereby forming a plurality of insulating patterns 183 that fully cover the respective organic semiconductors 154, as shown in FIG. 14 and FIG. 15.

The present invention is not limited to the LCDs described above, but is also applicable to other display devices that operate by TFTs, such as organic light emitting devices ("OLEDs") and electronic papers ("e-papers").

In the present invention, a photo etching process using a photoresist film or a barrier forming process, which would ordinarily be required to form a semiconductor pattern, can be omitted because the semiconductors are made of a photosensitive organic material. Also, even though the organic material is deposited by a solution process with low resolution, a deposited layer is changed to organic semiconductors with high resolution after being patterned by photolithography.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A method of manufacturing an organic thin film transistor array panel, the method comprising:
   forming a gate line on a substrate;
   forming a gate insulating layer on the gate line;
   forming a drain electrode and a data line with a source electrode on the gate insulating layer;
   forming a layer of a photosensitive organic material on the data line and the drain electrode;
   forming an organic semiconductor by selectively exposing the layer of photosensitive organic material to light;
   forming an insulation pattern covering the organic semiconductor; and
   forming a pixel electrode connected to the drain electrode, wherein forming an organic semiconductor is performed using hydrogen ($H^+$) as a catalyst.

2. The method of claim 1, wherein the photosensitive organic material is a soluble material.

3. The method of claim 1, wherein forming a layer of a photosensitive organic material is performed by a printing process, a spin coating process, or an ink-jet printing process.

4. The method of claim 1, wherein the photosensitive organic material for the layer of a photosensitive organic material is obtained from a reaction of pentacene and t-butyloxycarbonyl.

5. The method of claim 1, wherein, during forming an organic semiconductor, the photosensitive organic material layer undergoes a thermal-treatment after being exposed to light.

6. The method of claim 1, wherein forming an insulation pattern is performed at a low temperature with a dry process.

7. The method of claim 1, wherein forming an insulation pattern includes forming an insulating layer on the organic semiconductor and patterning the insulating layer by photolithography.

8. A method of manufacturing an organic thin film transistor array panel, the method comprising:
   forming a gate line on a substrate;
   forming a gate insulating layer on the gate line;
   forming a drain electrode and a data line with a source electrode on the gate insulating layer;
   forming a layer of a photosensitive organic material on the data line and the drain electrode;
   forming an organic semiconductor by selectively exposing the layer of photosensitive organic material to light;
   forming an insulation pattern covering the organic semiconductor; and
   forming a pixel electrode connected to the drain electrode, wherein the photosensitive organic material for the layer of a photosensitive organic material is obtained from a reaction of pentacene and t-butyloxycarbonyl.

9. The method of claim 8, wherein the photosensitive organic material is a soluble material.

10. The method of claim 8, wherein forming a layer of a photosensitive organic material is performed by a printing process, a spin coating process, or an ink-jet printing process.

11. The method of claim 8, wherein, during forming an organic semiconductor, the photosensitive organic material layer undergoes a thermal-treatment after being exposed to light.

12. The method of claim 8, wherein forming an insulation pattern is performed at a low temperature with a dry process.

13. The method of claim 8, wherein forming an insulation pattern includes forming an insulating layer on the organic semiconductor and patterning the insulating layer by photolithography.

* * * * *